US012665556B2

(12) United States Patent
An et al.

(10) Patent No.: US 12,665,556 B2
(45) Date of Patent: Jun. 23, 2026

(54) ELECTRONIC DEVICE COMPRISING POWER AMPLIFIER AND METHOD FOR OPERATING SAME

(71) Applicant: SAMSUNG ELECTRONICS CO., LTD., Suwon-si (KR)

(72) Inventors: Yongjun An, Suwon-si (KR); Hyoseok Na, Suwon-si (KR); Jaejin Yang, Suwon-si (KR); Hyunseok Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 18/379,937

(22) Filed: Oct. 13, 2023

(65) Prior Publication Data

US 2024/0039489 A1    Feb. 1, 2024

Related U.S. Application Data

(63) Continuation of application No. PCT/KR2022/005262, filed on Apr. 12, 2022.

(30) Foreign Application Priority Data

Apr. 13, 2021    (KR) ........................ 10-2021-0047548

(51) Int. Cl.
*H03F 3/24* (2006.01)
*H03F 3/195* (2006.01)
*H03F 3/72* (2006.01)

(52) U.S. Cl.
CPC ............. *H03F 3/245* (2013.01); *H03F 3/195* (2013.01); *H03F 3/72* (2013.01); *H03F 2200/06* (2013.01);

(Continued)

(58) Field of Classification Search
CPC . H03F 3/245; H03F 3/195; H03F 3/72; H03F 2200/06; H03F 2200/451;

(Continued)

(56) References Cited

U.S. PATENT DOCUMENTS 8,432,237 B2 * 4/2013 Klemens .................. H03H 7/38
                                                    333/132
9,042,844 B2    5/2015 Yu et al.
(Continued)

FOREIGN PATENT DOCUMENTS

EP        3 771 093 A1    1/2021
JP      2007-234738 A     9/2007
(Continued)

OTHER PUBLICATIONS

International Search Report (PCT/ISA/210) issued Jul. 25, 2022 by the International Searching Authority in International Patent Application No. PCT/KR2022/005262.
(Continued)

*Primary Examiner* — Hieu P Nguyen
(74) *Attorney, Agent, or Firm* — Sughrue Mion, PLLC

(57)    ABSTRACT

An electronic device includes: at least one antenna; and a power amplifier electrically connected to the at least one antenna. The power amplifier includes: a first amplification circuit; a first transformer; a first switch; a second amplification circuit; a second transformer; a second switch; the power combiner; and the third switch configured to electrically connect at least one of the first switch, the second switch, or an output port of the power combiner with the at least one antenna.

20 Claims, 13 Drawing Sheets

(52) U.S. Cl.
CPC .. *H03F 2200/451* (2013.01); *H03F 2200/541*
(2013.01); *H03F 2203/7209* (2013.01)

(58) Field of Classification Search
CPC ....... H03F 2200/541; H03F 2203/7209; H03F
2200/111; H03F 1/347; H03F 3/211;
H03F 3/24; H04B 1/00; H04B 1/0057
USPC ...................................... 330/295, 124 R, 301
See application file for complete search history.

(56) References Cited

U.S. PATENT DOCUMENTS

| | | | | |
|---|---|---|---|---|
| 9,065,541 | B2 * | 6/2015 | Rofougaran | ......... H04B 7/0874 |
| 9,564,860 | B2 | 2/2017 | Cam et al. | |
| 10,547,279 | B2 | 1/2020 | Watkins | |
| 11,121,733 | B2 | 9/2021 | Naniwa et al. | |
| 2005/0268909 | A1 | 12/2005 | Bonney et al. | |
| 2006/0293000 | A1 | 12/2006 | Sorrells et al. | |
| 2007/0152904 | A1 | 7/2007 | Castaneda et al. | |
| 2007/0210866 | A1 | 9/2007 | Sato et al. | |
| 2010/0277237 | A1 | 11/2010 | Sinha et al. | |
| 2010/0295629 | A1 | 11/2010 | Klemens et al. | |
| 2011/0001566 | A1 | 1/2011 | Seki et al. | |
| 2014/0199951 | A1 | 7/2014 | Yu et al. | |
| 2015/0050901 | A1 | 2/2015 | Lee et al. | |
| 2015/0214896 | A1 | 7/2015 | Xu et al. | |
| 2020/0052660 | A1 | 2/2020 | Cao et al. | |
| 2020/0195208 | A1 | 6/2020 | Yoshimi | |

FOREIGN PATENT DOCUMENTS

| | | |
|---|---|---|
| JP | 2011-15240 A | 1/2011 |
| KR | 10-1057736 B1 | 8/2011 |
| KR | 10-2012-0025544 A | 3/2012 |
| KR | 10-1881767 B1 | 7/2018 |
| KR | 10-2020-0018624 A | 2/2020 |

OTHER PUBLICATIONS

Written Opinion (PCT/ISA/237) issued Jul. 25, 2022 by the International Searching Authority in International Patent Application No. PCT/KR2022/005262.
Communication dated Jun. 30, 2025 issued by the Korean Intellectual Property Office in Korean Patent Application No. 10-2021-0047548.

* cited by examiner

ELECTRONIC DEVICE COMPRISING POWER AMPLIFIER AND METHOD FOR OPERATING SAME

CROSS-REFERENCE TO RELATED APPLICATIONS

This application is a by-pass continuation application of International Application No. PCT/KR2022/005262, filed on Apr. 12, 2022, which is based on and claims priority to Korean Patent Application No. 10-2021-0047548, filed on Apr. 13, 2021, in the Korean Intellectual Property Office, the disclosures of which are incorporated by reference herein their entireties.

BACKGROUND

1. Field

The disclosure relates to an apparatus and a method for controlling a power amplifier in an electronic device.

2. Description of Related Art

Due to development of information and communication technologies and semiconductor technologies, electronic devices may provide various functions. For example, the electronic device may provide short-range wireless communication functions (for example, Bluetooth, wireless LAN or near field communication (NFC)) and/or mobile communication functions (long-term evolution (LTE)), LTE-advanced (LTE-A), or 5th generation new radio (5G NR).

The electronic device may generate a radio frequency (RF) signal for wireless communication. A circuit (for example, radio frequency front end (RFFE)) for processing an RF signal may need a predetermined physical area within the electronic device.

As a structure of the RFFE is relatively complex, a relatively larger physical area may be needed. For example, when an electronic device supports multiple transmissions (multiple Tx), the structure of the RFFE for transmission of a plurality of RF signals becomes relatively complex, and thus, a physical area for the RFFE for processing the RF signal may be relatively large. As the physical area occupied by the RFFE in the electronic device becomes larger, the size of the electronic device may increase, and thus, the cost may increase.

SUMMARY

Provided are an apparatus and a method for reducing complexity of a circuit (for example, a radio frequency front end (RFFE)) for processing a radio frequency (RF) signal in the electronic device.

According to one aspect of the disclosure, an electronic device includes: at least one antenna; and a power amplifier electrically connected to the at least one antenna. The power amplifier includes: a first amplification circuit disposed on a first electrical path between a first input port of the power amplifier and the at least one antenna, the first amplification circuit being configured to amplify a first signal provided through the first input port and to output a first output signal; a first transformer disposed on the first electrical path between the first amplification circuit and the at least one antenna; a first switch disposed on the first electrical path between the first transformer and the at least one antenna, the first switch being configured to electrically connect the first transformer with a third switch or a power combiner; a second amplification circuit disposed on a second electrical path between a second input port of the power amplifier and the at least one antenna, the second amplification circuit being configured to amplify a second signal provided through the second input port and to generate a second output signal; a second transformer disposed on the second electrical path between the second amplification circuit and the at least one antenna; a second switch disposed on the second electrical path between the second transformer and the at least one antenna, the second switch being configured to electrically connect the second transformer with the third switch or the power combiner; the power combiner configured to combine power of the first output signal provided from the first transformer through the first switch and power of the second output signal provided from the second transformer through the second switch and to generate a third output signal; and the third switch configured to electrically connect at least one of the first switch, the second switch, or an output port of the power combiner with the at least one antenna.

The first transformer may be configured to maintain a phase of the first output signal provided from the first amplification circuit, and wherein the second transformer is configured to invert a phase of the second output signal provided from the second amplification circuit.

The power amplifier further includes: a balun circuit; a fourth switch disposed on the first electrical path between the first input port and the first amplification circuit, the fourth switch being configured to electrically connect the first input port with a fifth switch or the balun circuit; the fifth switch disposed on the first electrical path between the fourth switch and the first amplification circuit, the fifth switch being configured to electrically connect the first amplification circuit with the fourth switch or the balun circuit; and a sixth switch disposed on the second electrical path between the second input port and the second amplification circuit, the sixth switch being configured to electrically connect the second amplification circuit with the second input port or the balun circuit.

The electronic device may further include a processor electrically connected to the power amplifier, wherein the processor is configured to control the fourth switch and the fifth switch to electrically connect the first input port with the first amplification circuit, based on target power of a signal transmitted by the electronic device in a single frequency band, the target power being satisfying reference power, and wherein the first signal provided through the first input port is input into the first amplification circuit.

The processor may be further configured to, based on the target power of the signal transmitted by the electronic device through the single frequency band satisfying the reference power, control the first switch and the third switch to electrically connect the first transformer with the at least one antenna, and wherein the first output signal of the first amplification circuit is output to the at least one antenna through the first transformer, the first switch, and the third switch.

The processor may be further configured to, based on target power of the signal transmitted by the electronic device through the single frequency band not satisfying the reference power, control the fourth switch, the fifth switch, and the sixth switch to electrically connect the first input port with an input port of the balun circuit and to electrically connect output port of the balun circuit with the first amplification circuit and the second amplification circuit, wherein the first signal provided through the first input port is input into the balun circuit, and wherein an output signal of the balun circuit is input into the first amplification circuit and the second amplification circuit.

The processor may be further configured to, based on the target power of the signal transmitted by the electronic device through the single frequency band not satisfying the reference power, control the first switch, the second switch, and the third switch to electrically connect the first transformer and the second transformer with the power combiner and to electrically connect the power combiner with the at least one antenna, wherein the power combiner is further configured to combine the first output signal provided through the first transformer and the second output signal provided through the second transformer and to generate the third output signal, and wherein the third output signal generated by the power combiner is output to the at least one antenna through the third switch.

The electronic device may further include a power supply circuit, wherein the processor is further configured to, based on the electronic device transmitting the signal through the single frequency band, control the power supply circuit to supply first power to the first amplification circuit and the second amplification circuit.

The processor may be further configured to, based on the electronic device transmitting the signal through multiple frequency bands, control the fourth switch, the fifth switch, and the sixth switch to electrically connect the first input port with the first amplification circuit and electrically connect the second input port with the second amplification circuit, wherein the first signal provided through the first input port is input into the first amplification circuit, and wherein the second signal provided through the second input port is input into the second amplification circuit.

The processor may be further configured to, based on the electronic device transmitting the signal through the multiple frequency bands, control the first switch, the second switch, and the third switch to electrically connect the first transformer with the at least one antenna and to electrically connect the second transformer with the at least one antenna, wherein the first output signal of the first amplification circuit is output to at least one antenna through the first transformer, the first switch, and the third switch, and wherein the second output signal of the second amplification circuit is output to the at least one antenna through the second transformer, the second switch, and the third switch.

The electronic device may further include a power supply circuit, wherein the processor is further configured to, based on the electronic device transmitting the signal through the multiple frequency bands, control the power supply circuit to supply first power to the first amplification circuit and to supply second power different from the first power to the second amplification circuit.

The processor may include a communication processor.

The electronic device may further include a radio frequency integrated circuit (RFIC) disposed between the power amplifier and the processor, the RFIC being configured to convert a baseband signal provided from the processor into a radio frequency (RF) signal.

The power amplifier may be configured to amplify the RF signal provided from the RFIC and output the RF signal to an outside through the at least one antenna.

The electronic device may further include an intermediate frequency integrated circuit (IFIC) disposed between the processor and the RFIC, the IFIC being configured to convert the baseband signal provided from the processor into an intermediate frequency (IF) signal, wherein the RFIC is configured to convert the IF signal provided from the IFIC into the RF signal.

According to one or more embodiments of the disclosure, an electronic device may support a single transmission and/or multiple transmissions through a first amplification circuit and/or a second amplification circuit included in a differential power amplifier, so as to reduce complexity of the circuit (for example, the RFFE) for processing the RF signal.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 3 is a block diagram of an electronic device including a power amplifier according to one or more embodiments;

FIG. 4 is a block diagram of a power amplifier according to one or more embodiments;

FIG. 6 illustrates an example of a structure of the power amplifier for amplifying a high power signal in an electronic device according to one or more embodiments;

FIG. 9 illustrates an example of a structure for supporting multiple transmissions by an electronic device according to one or more embodiments;

DETAILED DESCRIPTION

Hereinafter, various embodiments are described in detail with reference to the accompanying drawings.

Figure 1:
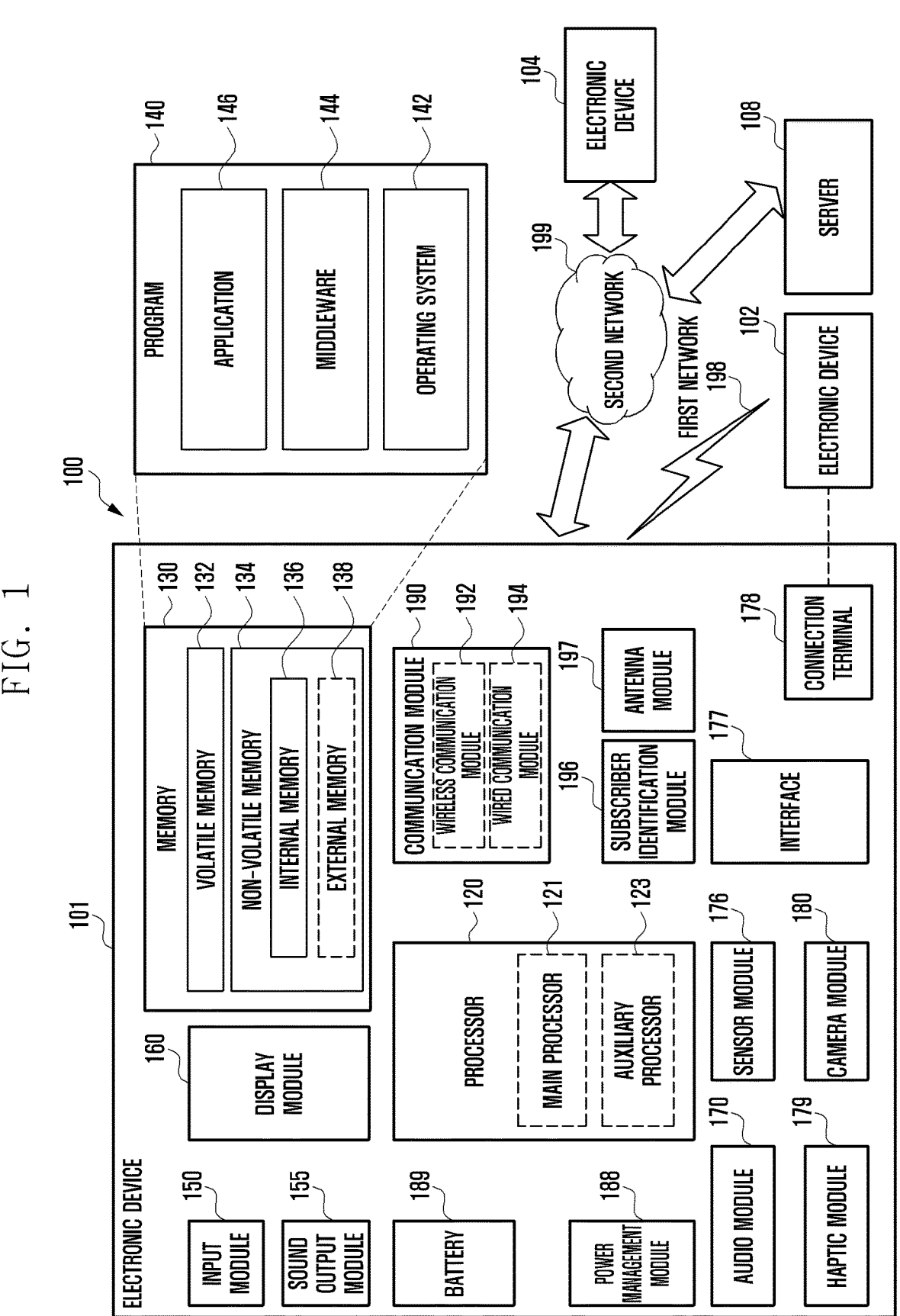
FIG. 1 is a block diagram illustrating an electronic device within a network environment according to various embodiments.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC. According to an embodiment, the subscriber identification module 196 may include a plurality of subscriber identification modules. For example, the plurality of subscriber identification modules may store different subscriber information.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band. For example, the plurality of antennas may include a patch array antenna and/or a dipole array antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
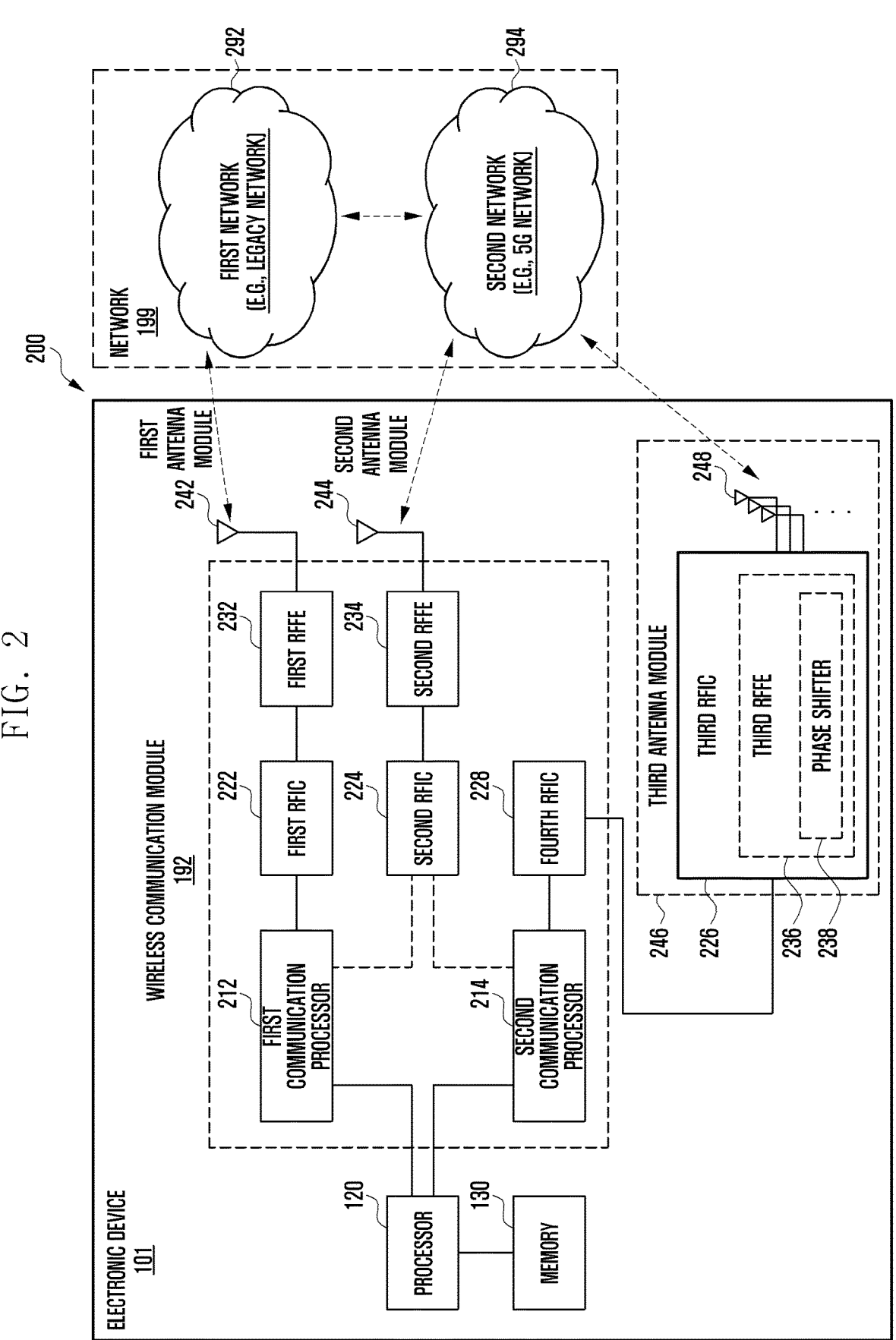
FIG. 2 is a block diagram of an electronic device for supporting legacy network communication and 5G network communication according to various embodiments.

FIG. 2 is a block diagram 200 illustrating an example electronic device 101 supporting legacy network communication and 5G network communication according to various embodiments.

Referring to FIG. 2, according to various embodiments, the electronic device 101 may include a first communication processor (e.g., including processing circuitry) 212, a second communication processor (e.g., including processing circuitry) 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may include the processor 120 and the memory 130. The network 199 may include a first network 292 and a second network 294. According to an embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may be at least a part of the wireless communication module 192. According to an embodiment, the fourth RFIC 228 may be omitted, or may be included as a part of the third RFIC 226.

The first communication processor 212 may establish a communication channel of a band to be used for wireless communication with the first network 292, and may support legacy network communication via the established communication channel. According to an embodiment, the first network may be a legacy network including second generation (2G), third generation (3G), fourth generation (4G), or long-term evolution (LTE) network. The second communication processor 214 may establish a communication channel corresponding to a designated band (e.g., approximately 6 GHz to 60 GHz) among bands to be used for wireless communication with the second network 294, and may support 5G network communication via the established communication channel. According to an embodiment, the second network 294 may be a 5G network (e.g., new radio (NR)) defined in 3GPP. In addition, according to an embodiment, the first communication processor 212 or the second communication processor 214 may establish a communication channel corresponding to another designated band (e.g., approximately 6 GHz or less) among bands to be used for wireless communication with the second network 294, and may support 5G network communication via the established communication channel. According to an embodiment, the first communication processor 212 and the second communication processor 214 may be implemented in a single chip or a single package. According to an embodiment, the first communication processor 212 or the second communication processor 214 may be implemented in a single chip or a single package, together with the processor 120, the auxiliary processor 123, or the communication module 190.

According to an embodiment, the first communication processor 212 may perform data transmission or reception with the second communication processor 214. For example, data which has been classified to be transmitted via the second network 294 may be changed to be transmitted via the first network 292.

In this instance, the first communication processor 212 may receive transmission data from the second communication processor 214. For example, the first communication processor 212 may perform data transmission or reception with the second communication processor 214 via an inter-processor interface. The inter-processor interface may be implemented as, for example, a universal asynchronous receiver/transmitter (UART) (e.g., a high speed-UART (HS-UART)) or a peripheral component interconnect bus express (PCIe), but the type of interface is not limited thereto. For example, the first communication processor 212 and the second communication processor 214 may exchange control information and packet data information using, for example, a shared memory. For example, the first communication processor 212 may perform transmission or reception of various types of information such as sensing information, information associated with an output strength, and resource block (RB) allocation information, with the second communication processor 214.

Depending on implementation, the first communication processor 212 may not be directly connected to the second communication processor 214. In this instance, the first communication processor 212 may perform data transmission or reception with the second communication processor 214, via the processor 120 (e.g., an application processor). For example, the first communication processor 212 and the second communication processor 214 may perform data transmission or reception via the processor 120 (e.g., an application processor) and a HS-UART interface or a PCIe interface, but the type of interface is not limited. For example, the first communication processor 212 and the second communication processor 214 may exchange control information and packet data information using the processor 120 (e.g., an application processor) and a shared memory. According to an embodiment, the first communication processor 212 and the second communication processor 214 may be implemented in a single chip or a single package. According to various embodiments, the first communication processor 212 or the second communication processor 214 may be implemented in a single chip or a single package, together with the processor 120, the auxiliary processor 123, or the communication module 190.

In the case of transmission, the first RFIC 222 may convert a baseband signal generated by the first communication processor 212 into a radio frequency (RF) signal in the range of approximately 700 MHz to 3 GHz, which is used in the first network 292 (e.g., a legacy network). In the case of reception, an RF signal is obtained from the first network 292 (e.g., a legacy network) via an antenna (e.g., the first antenna module 242), and may be preprocessed via an RFFE (e.g., the first RFFE 232). The first RFIC 222 may convert the preprocessed RF signal into a baseband signal so that the baseband signal is processed by the first communication processor 212.

In the case of transmission, the second RFIC 224 may convert a baseband signal generated by the first communication processor 212 or the second communication processor 214 into an RF signal (hereinafter, a 5G Sub6 RF signal) in an Sub6 band (e.g., approximately 6 GHz or less) used in the second network 294 (e.g., a 5G network). In the case of reception, a 5G Sub6 RF signal may be obtained from the second network 294 (e.g., a 5G network) via an antenna (e.g., the second antenna module 244), and may be preprocessed by an RFFE (e.g., the second RFFE 234). The second RFIC 224 may convert the preprocessed 5G Sub6 RF signal into a baseband signal so that the signal may be processed by a corresponding communication processor among the first communication processor 212 or the second communication processor 214.

The third RFIC 226 may convert a baseband signal generated by the second communication processor 214 into an RF signal (hereinafter, a 5G Above6 RF signal) of a 5G Above6 band (e.g., approximately 6 GHz to 60 GHz) to be used in the second network 294 (e.g., a 5G network). In the case of reception, a 5G Above6 RF signal is obtained from the second network 294 (e.g., a 5G network) via an antenna (e.g., the antenna 248), and may be preprocessed by the third RFFE 236. The third RFIC 226 may convert the preprocessed 5G Above6 RF signal into a baseband signal so that the signal is processed by the second communication processor 214. According to an embodiment, the third RFFE 236 may be implemented as a part of the third RFIC 226.

According to an embodiment, the electronic device 101 may include the fourth RFIC 228, separately from or, as a part of, the third RFIC 226. In this instance, the fourth RFIC 228 may convert a baseband signal produced by the second communication processor 214 into an RF signal (hereinafter, an IF signal) in an intermediate frequency band (e.g., approximately 9 GHz to 11 GHz), and may transfer the IF signal to the third RFIC 226. The third RFIC 226 may convert the IF signal into a 5G Above6 RF signal. In the case of reception, a 5G Above6 RF signal may be received from the second network 294 (e.g., a 5G network) via an antenna (e.g., the antenna 248), and may be converted into an IF signal by the third RFIC 226. The fourth RFIC 228 may convert the IF signal into a baseband signal so that the second communication processor 214 is capable of processing the baseband signal.

According to an embodiment, the first RFIC 222 and the second RFIC 224 may be implemented as at least a part of a single chip or a single package. According to an embodiment, the first RFFE 232 and the second RFFE 234 may be implemented as at least a part of a single chip or single package. According to an embodiment, at least one of the first antenna module 242 or the second antenna module 244 may be omitted or may be combined with another antenna module, to process RF signals of a plurality of corresponding bands.

According to an embodiment, the third RFIC 226 and the antenna 248 may be disposed in the same substrate, and may form a third antenna module 246. For example, the wireless communication module 192 or the processor 120 may be disposed in a first substrate (e.g., a main PCB). In this instance, the third RFIC 226 is disposed in a part (e.g., a lower part) of a second substrate (e.g., a sub PCB) different from the first substrate, and the antenna 248 is disposed in another part (e.g., an upper part), so that the third antenna module 246 may be formed. By disposing the third RFIC 226 and the antenna 248 in the same substrate, the length of a transmission line therebetween may be reduced. For example, this may reduce a loss (e.g., a diminution) of a high-frequency band signal (e.g., approximately 6 GHz to 60 GHz) used for 5G network communication, the loss being caused by a transmission line. Accordingly, the electronic device 101 may improve the quality or speed of communication with the second network 294 (e.g., a 5G network).

According to an embodiment, the antenna 248 may be implemented as an antenna array including a plurality of antenna elements which may be used for beamforming. In this instance, the third RFIC 226, for example, may include a plurality of phase shifters 238 corresponding to a plurality of antenna elements, as a part of the third RFFE 236. In the case of transmission, each of the plurality of phase shifters

238 may shift the phase of a 5G Above6RF signal to be transmitted to the outside of the electronic device 101 (e.g., a base station of a 5G network) via a corresponding antenna element. In the case of reception, each of the plurality of phase shifters 238 may shift the phase of a 5G Above6 RF signal received from the outside via a corresponding antenna element into the same or substantially the same phase. This may enable transmission or reception via beamforming between the electronic device 101 and the outside.

The second network 294 (e.g., a 5G network) may operate independently (e.g., Standalone (SA)) from the first network 292 (e.g., a legacy network), or may operate by being connected thereto (e.g., Non-Standalone (NSA)). For example, in the 5G network, only an access network (e.g., 5G radio access network (RAN) or next generation RAN (NG RAN)) may exist, and a core network (e.g., next generation core (NGC)) may not exist. In this instance, the electronic device 101 may access the access network of the 5G network, and may access an external network (e.g., the Internet) under the control of the core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by another component (e.g., the processor 120, the first communication processor 212, or the second communication processor 214).

Figure 3:
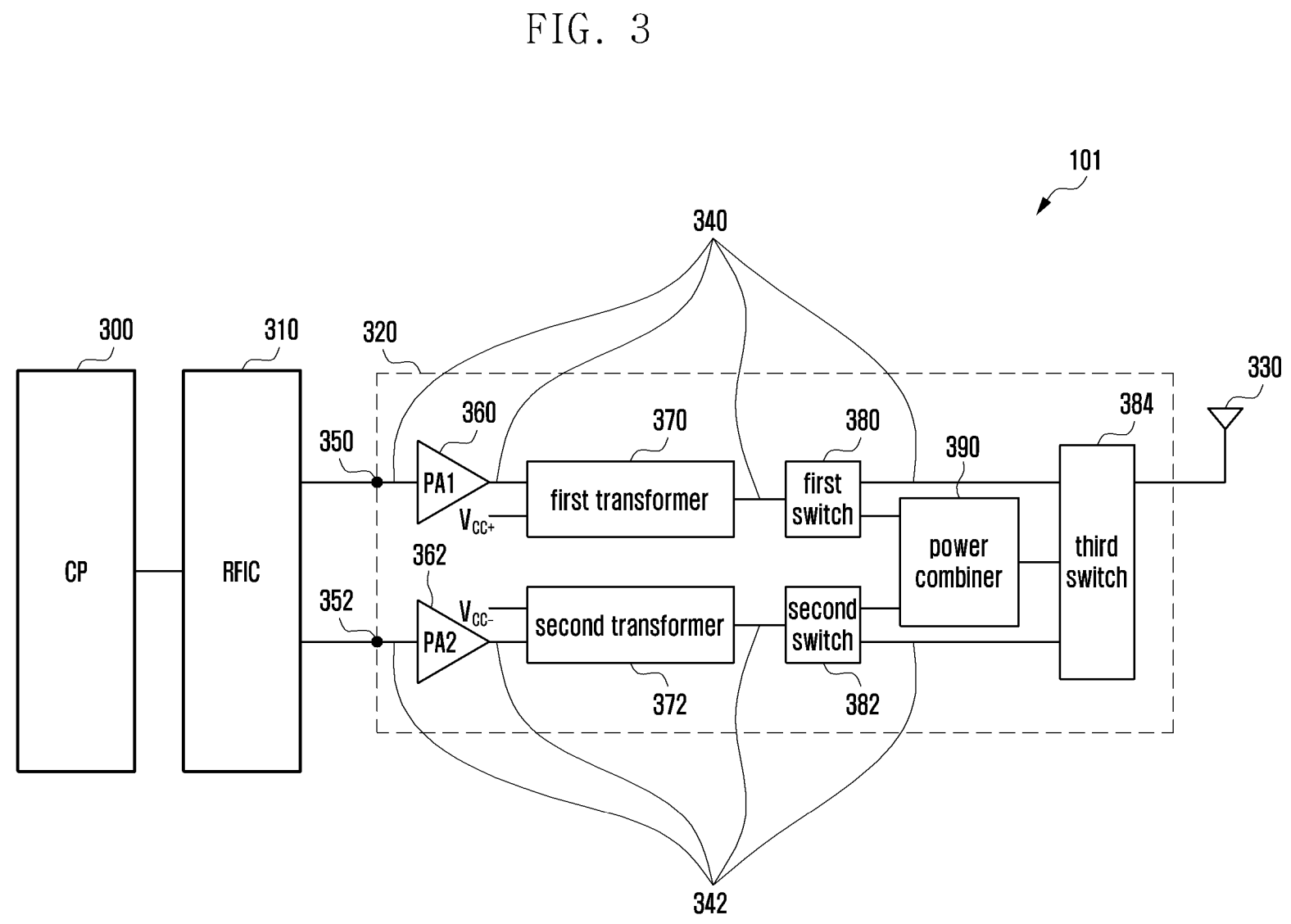
Figure 5:
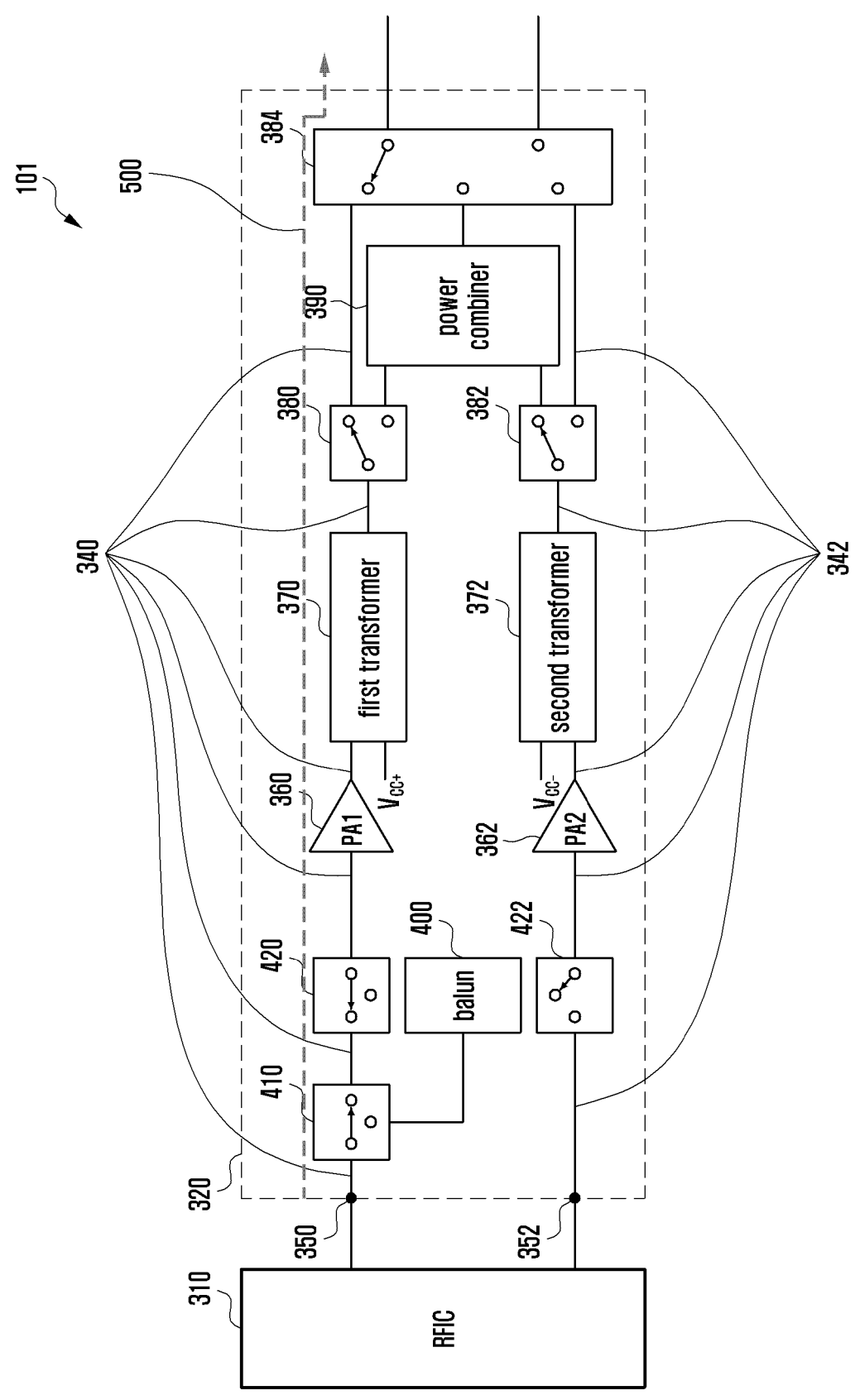
FIG. 5 illustrates an example of a structure of the power amplifier for amplifying a low power signal in an electronic device according to one or more embodiments.
Figure 6:
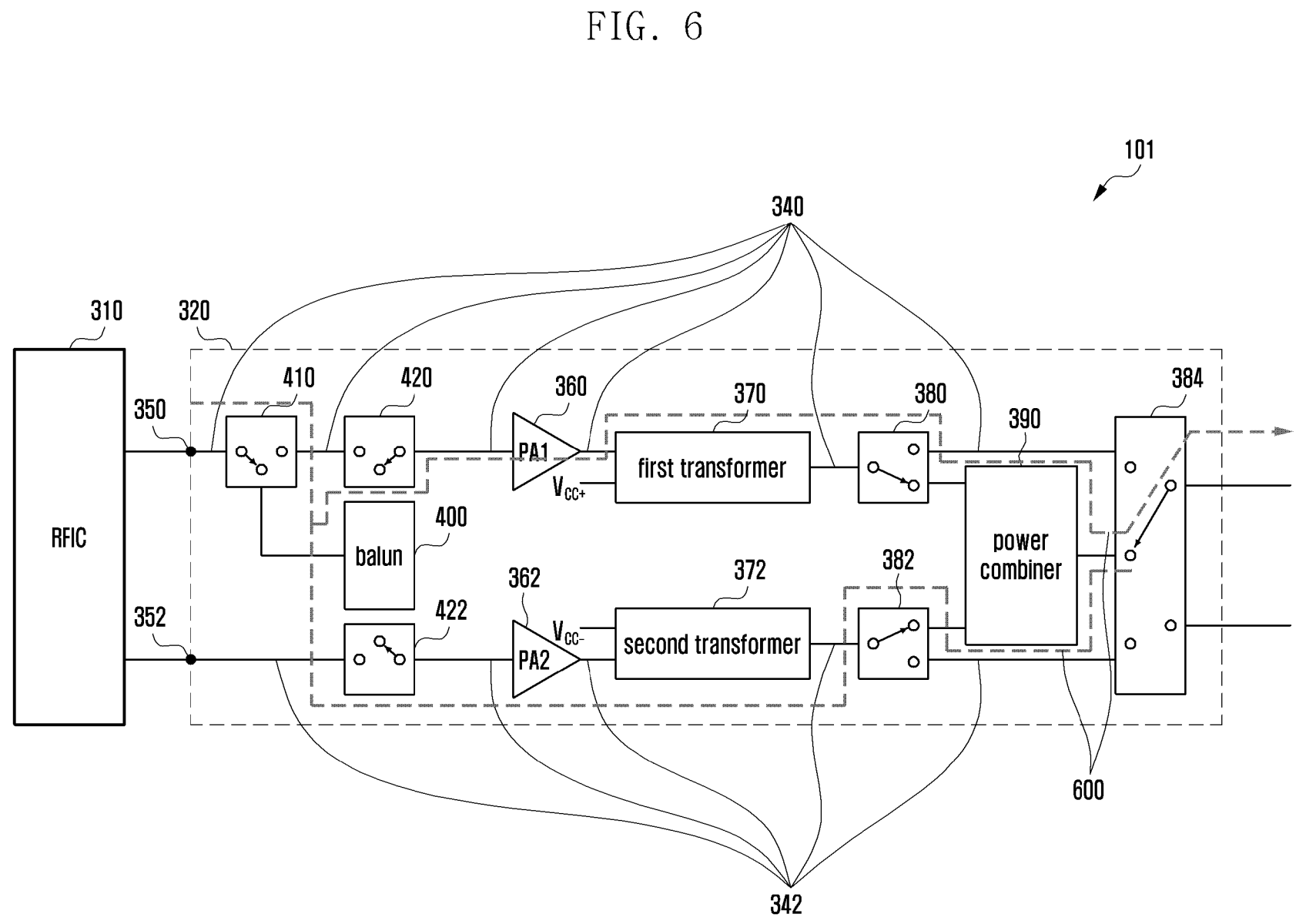
Figure 7:
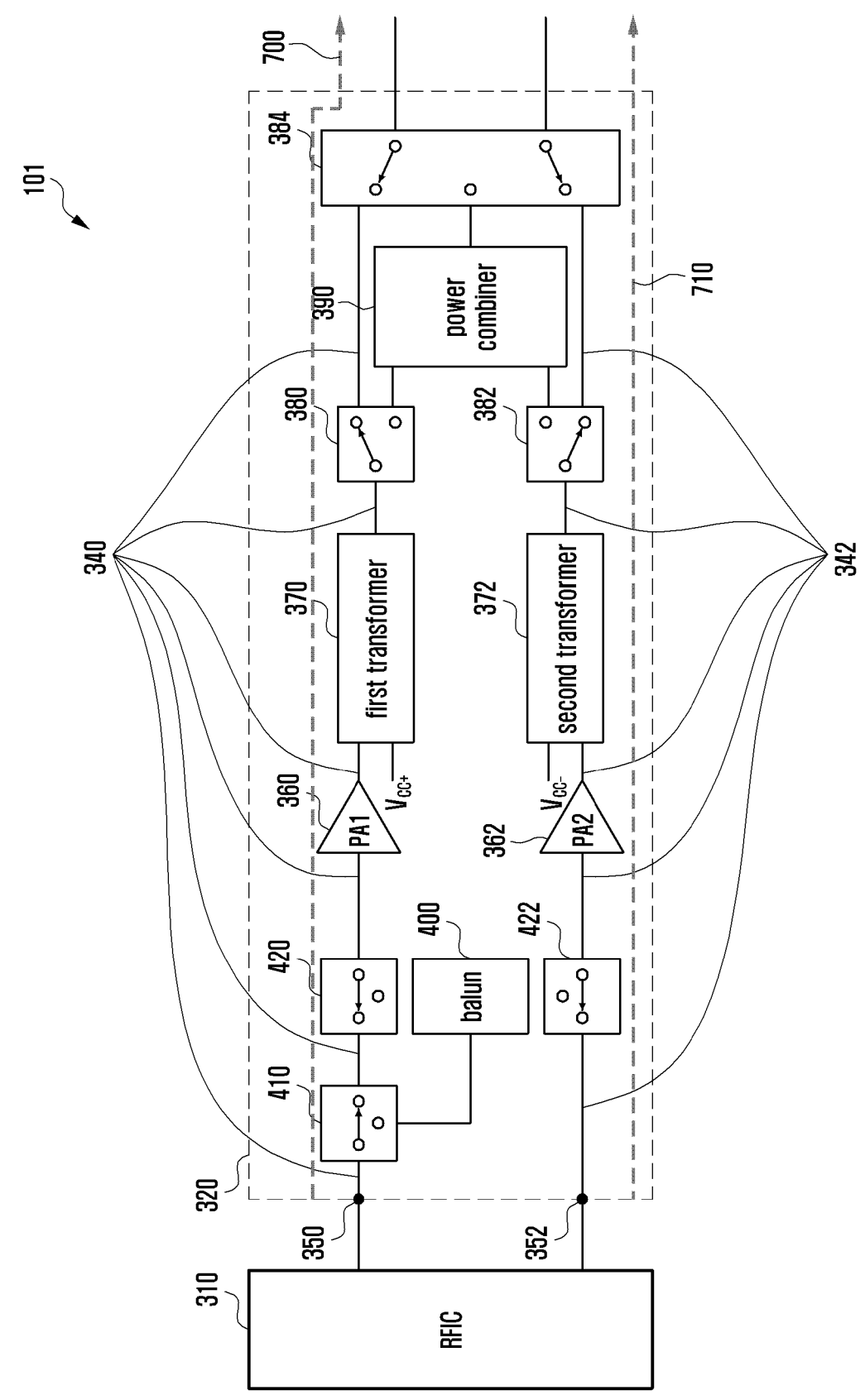
FIG. 7 illustrates an example of a structure of the power amplifier for supporting multiple transmissions in the electronic device according to one or more embodiments.

FIG. 3 is a block diagram of an electronic device including a power amplifier according to one or more embodiments. For example, at least some of FIG. 3 may refer to FIGS. 5, 6, and 7. FIG. 5 illustrates an example of a structure of the power amplifier for amplifying a 'low' power signal in an electronic device according to one or more embodiments. FIG. 6 illustrates an example of a structure of the power amplifier for amplifying a 'high' power signal in an electronic device according to one or more embodiments. FIG. 7 illustrates an example of a structure of the power amplifier for supporting multiple transmissions in an electronic device according to one or more embodiments.

According to one or more embodiments, referring to FIG. 3, the electronic device 101 may include a communication processor (CP) 300 (for example, the processor 120 of FIG. 1, or the first communication processor 212 or the second communication processor 214 of FIG. 2), an RFIC 310 (for example, the wireless communication module 192 of FIG. 1 or the third RFIC 226 of FIG. 2), a power amplifier 320, and/or at least one antenna 330 (for example, the antenna module 197 of FIG. 1 or the antennas 248 of FIG. 2).

According to one or more embodiments, the CP 300 may generate a baseband signal for wireless communication. According to an embodiment, the CP 300 may provide the baseband signal to the RFIC 310. According to an embodiment, the CP 300 may transmit the baseband signal to an intermediate frequency integrated circuit (IFIC). The IFIC may up-convert the baseband signal provided from the CP 300 into an intermediate frequency (IF) signal and provide the IF signal to the RFIC 310. For example, the IFIC may be located between the CP 300 and the RFIC 310.

According to one or more embodiments, the RFIC 310 may up-convert the baseband signal provided from the CP 300 into an RF signal. According to an embodiment, the RFIC 310 may up-convert the IF signal provided from an IFIC into an RF signal.

According to one or more embodiments, the power amplifier 320 may amplify the signal provided from the RFIC 310 to be output through at least one antenna 330. According to an embodiment, as shown in FIG. 3, the power amplifier 320 may include a first amplification circuit 360, a second amplification circuit 362, a first transformer 370, a second transformer 372, a first switch 380, a second switch 382, a third switch 384, and/or a power combiner 390.

According to an embodiment, the first amplification circuit 360 may be disposed on a first electrical path 340 between a first input port 350 of the power amplifier 320 and at least one antenna 330, and may amplify a first signal provided through the first input port 350 to generate a first output signal. The first amplification circuit 360 may output the first output signal to the first transformer 370.

According to an embodiment, the first transformer 370 may be disposed on the first electrical path 340 between the first amplification circuit 360 and at least one antenna 330. For example, the first transformer 370 may supply power to the first amplification circuit 360. For example, the first transformer 370 may transfer the first output signal output from the first amplification circuit 360 to at least one antenna 330 and serve to perform broad band matching.

According to an embodiment, the first switch 380 may be disposed on the first electrical path 340 between the first transformer 370 and at least one antenna 330 and may transmit an output signal of the first transformer 370 to the third switch 384 or the power combiner 390. For example, the first switch 380 may electrically connect the first transformer 370 with the third switch 384 or the power combiner 390. For example, when the power amplifier 320 operates in a low power mode in a single transmission mode of the electronic device 101, the first switch 380 may electrically connect the first transformer 370 with the third switch 384 as illustrated in FIG. 5. The output signal of the first transformer 370 may be transmitted to the third switch 384 through the first switch 380 as indicated by reference numeral 500. For example, when the electronic device 101 operates in a multi-transmission mode, the first switch 380 may electrically connect the first transformer 370 with the third switch 384 as illustrated in FIG. 7. The output signal of the first transformer 370 may be transmitted to the third switch 384 through the first switch 380 as indicated by reference numeral 700. For example, when the power amplifier 320 operates in a high power mode in the single transmission mode of the electronic device 101, the first switch 380 may electrically connect the first transformer 370 with the power combiner 390 as illustrated in FIG. 6. The output signal of the first transformer 370 may be transmitted to the power combiner 390 through the first switch 380 as indicated by reference numeral 600. For example, the single transmission mode may include a transmission mode of the electronic device 101 in which the electronic device 101 transmits a signal in a single frequency band through at least one antenna 330. For example, the low power mode of the single transmission mode may include an operation mode of the power amplifier 320 in which target power for outputting a signal by the electronic device 101 in the single transmission mode through at least one antenna 330 satisfies reference power. For example, the state in which the reference power is satisfied may include a state in which target power for outputting a signal by the electronic device 101 through at least one antenna 330 is equal to or lower than reference power. For example, the reference power may be configured on the basis of maximum output power (for example, P3 dB) for maintaining linearity of the power amplifier 320. For example, the reference power may be changed on the basis of a communication pattern of the electronic device 101, a surrounding environment, or user settings. For example, the high power mode of the single transmission mode may include an operation mode of the power amplifier 320 in which the target power for outputting a signal by the electronic device 101 in the single transmission mode through at least one antenna 330 does not satisfy the reference power. For example, the state in which the reference power is not satisfied may include a state in which the target power for outputting a signal by the electronic device 101 through at least one antenna 330 is higher than the reference power. For example, the multi-transmission mode may include a transmission mode of the electronic device 101 in which the electronic device 101 transmits signals in multiple frequency bands through at least one antenna 330.

According to an embodiment, the second amplification circuit 362 may be disposed on a second electrical path 342 between a second input port 352 of the power amplifier 320 and at least one antenna 330, and may amplify a second signal provided through the second input port 352 to generate a second output signal. The second amplification circuit 362 may output the second output signal to the second transformer 372.

According to an embodiment, the second transformer 372 may be disposed on the second electrical path 342 between the second amplification circuit 362 and at least one antenna 330. For example, the second transformer 372 may supply power to the second amplification circuit 362. For example, the second transformer 372 may transfer the second output signal output from the second amplification circuit 362 to at least one antenna 330 and serve to perform broad band matching. For example, the second transformer 372 may invert the phase of the second output signal provided from the second amplification circuit 362 and output the inverted second output signal. For example, the second transformer 372 may shift the phase of the second output signal provided from the second amplification circuit 362 to have the same phase as the output signal of the first transformer 370.

According to an embodiment, the second switch 382 may be disposed on the second electrical path 342 between the second transformer 372 and at least one antenna 330 and may transmit an output signal of the second transformer 372 to the third switch 384 or the power combiner 390. For example, the second switch 382 may electrically connect the second transformer 372 with the third switch 384 or the power combiner 390. For example, when the electronic device 101 operates in a multi-transmission mode, the second switch 382 may electrically connect the second transformer 372 with the third switch 384 as illustrated in FIG. 7. The output signal of the second transformer 372 may be transmitted to the third switch 384 through the second switch 282 as indicated by reference numeral 710. For example, when the power amplifier 320 operates in a high power mode in the single transmission mode of the electronic device 101, the second switch 382 may electrically connect the second transformer 372 with the power combiner 390 as illustrated in FIG. 6. The output signal of the second transformer 372 may be transmitted to the power combiner 390 through the second switch 282 as indicated by reference numeral 600.

According to an embodiment, the power combiner 390 may combine the output signal of the first transformer 370 provided from the first switch 380 and the output signal of the second transformer 372 provided from the second switch 382 into one signal and output the signal. For example, the power combiner 390 may combine signals having the same phase provided from the first transformer 370 and the second transformer 372 into one signal to increase output power.

According to an embodiment, the third switch 384 may electrically connect at least one antenna 330 with at least one of the first switch 380, the second switch 382, or the power combiner 390 on the basis of the transmission mode of the electronic device 101. For example, when the power amplifier 320 operates in a low power mode in a single transmission mode of the electronic device 101, the third switch 384 may electrically connect the first switch 380 with at least one antenna 330 to output the output signal of the first transformer 370 through at least one antenna 330 as indicated by reference numeral 500. For example, the third switch 384 may transmit the output signal of the first transformer 370 provided from the first switch 380 along the first transmission path of at least one antenna 330 corresponding to a first frequency band (for example, B1 band) or the second transmission path of at least one antenna 330 corresponding to a second frequency band (for example, B3 band).

For example, when the electronic device 101 operates in the multi-transmission mode, the third switch 384 may electrically connect the first switch 380 and the second switch 382 with at least one antenna 330 to output the output signal of the first transformer 370 provided from the first switch 380 and the output signal of the second transformer 372 provided from the second switch 382 through at least one antenna 330 as indicated by reference numerals 700 and 710 of FIG. 7. For example, the third switch 384 may transmit the output signal of the first transformer 370 provided from the first switch 380 along the first transmission path of at least one antenna 330 corresponding to the first frequency band (for example, B1 band) and transmit the output signal of the second transformer 372 provided from the second switch 382 along the second transmission path of at least one antenna 330 corresponding to the second frequency band (for example, B3 band).

For example, when the power amplifier 320 operates in a high power mode in the single transmission mode of the electronic device 101, the third switch 384 may electrically connect the power combiner 390 with at least one antenna 330 to output the signal combined by the power combiner 390 through at least one antenna 330 as indicated by reference numeral 600 of FIG. 6. For example, the third switch 384 may transmit the signal combined by the power combiner 390 along the first transmission path of at least one antenna 330 corresponding to the first frequency band (for example, B1 band) or the second transmission path of at least one antenna 330 corresponding to the second frequency band (for example, B3 band).

According to one or more embodiments, the CP 300 may control the first switch 380, the second switch 382, and/or the third switch 384 included in the power amplifier 320 on the basis of the operation mode of the electronic device 101. According to an embodiment, the CP 300 may identify the transmission mode of the electronic device 101 on the basis of a frequency band of a signal transmitted by the electronic device 101 through at least one antenna 330. The CP 300 may identify the operation mode of the power amplifier 320 on the basis of target power for outputting a signal through at least one antenna 330. According to an embodiment, when the power amplifier 320 operates in a low power mode in the single transmission mode of the electronic device 101, the CP 300 may control the first switch 380 and the third switch 384 to electrically connect the first transformer 370 and at least one antenna 330 as indicated by reference numeral 500 of FIG. 5. For example, the output signal of the first transformer 370 may be output through at least one antenna 330 electrically connected or operatively connected to the first transformer 370 by the first switch 380 and the third switch 384.

According to an embodiment, when the electronic device 101 operates in the multi-transmission mode, the CP 300 may control the first switch 380, the second switch 382, and the third switch 384 to electrically connect the first transformer 370 and the second transformer 372 with at least one antenna 330 as indicated by reference numeral 700 of FIG. 7. For example, the output signal of the first transformer 370 may be output through at least one antenna 330 electrically connected or operatively connected to the first transformer 370 by the first switch 380 and the third switch 384. For example, the output signal of the second transformer 372 may be output through at least one antenna 330 electrically connected or operatively connected to the second transformer 372 by the second switch 382 and the third switch 384.

According to an embodiment, when the power amplifier 320 operates in the high power mode in the single transmission mode of the electronic device 101, the CP 300 may control the first switch 380 and the second switch 382 to electrically connect the first transformer 370 and the second transformer 372 with the power combiner 390 as indicated by reference numeral 600 of FIG. 6. The CP 300 may control the third switch 384 to electrically connect the power combiner 390 with at least one antenna 330. For example, the output signal of the power combiner 390 may be output through at least one antenna 330 electrically connected or operatively connected to the power combiner 390 by the third switch 384.

According to one or more embodiments, when the electronic device 101 operates in the single transmission mode, the power amplifier 320 may simultaneously use the first amplification circuit 360 and the second amplification circuit 362. For example, when the electronic device 101 operates in the single transmission mode, the power amplifier 320 may simultaneously use the first amplification circuit 360 and the second amplification circuit 362 regardless of the operation mode of the power amplifier 320. According to an embodiment, when the electronic device 101 operates in the single transmission mode, the CP 300 may control the first switch 380 and the second switch 382 to electrically connect the first transformer 370 and the second transformer 372 with the power combiner 390 as indicated by reference numeral 600 of FIG. 6. The CP 300 may control the third switch 384 to electrically connect the power combiner 390 and at least one antenna 330 as indicated by reference numeral 600. For example, the output signal of the power combiner 390 may be output through at least one antenna 330 electrically connected or operatively connected to the power combiner 390 by the third switch 384.

Figure 4:
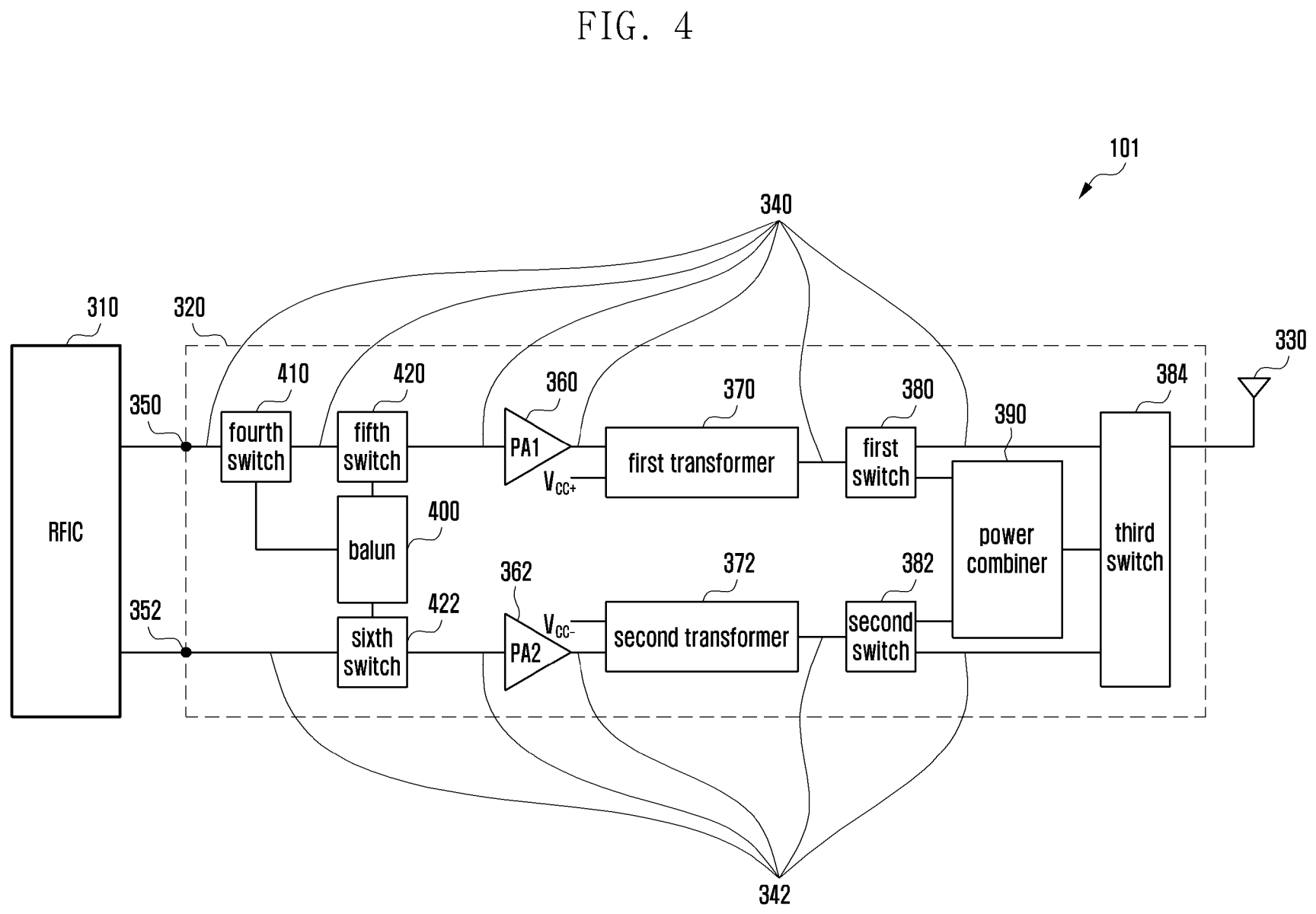

FIG. 4 is a block diagram of a power amplifier according to one or more embodiments. For example, at least some of FIG. 4 may refer to FIGS. 5, 6, and 7.

According to one or more embodiments referring to FIG. 4, the power amplifier 320 may include the first amplification circuit 360, the second amplification circuit 362, the first transformer 370, the second transformer 372, the first switch 380, the second switch 382, the third switch 384, the power combiner 390, a balanced to unbalanced (balun) circuit 400, a fourth switch 410, a fifth switch 420, and/or a sixth switch 422. According to an embodiment, in order to avoid overlapping with FIG. 3, a detailed description of the first amplification circuit 360, the second amplification circuit 362, the first transformer 370, the second transformer 372, the first switch 380, the second switch 382, the third switch 384, and the power combiner 390 is omitted.

According to one or more embodiments, the fourth switch 410 may be disposed on the first electrical path 340 between the first input port 350 of the power amplifier 320 and the first amplification circuit 360. The fourth switch 410 may electrically connect the first input port 350 with the fifth switch 420 or the balun circuit 400 (for example, an input port of the balun circuit 400) on the basis of the transmission mode of the electronic device 101 and/or the operation mode of the power amplifier 320. For example, when the power amplifier 320 operates in the low power mode in the single transmission mode of the electronic device 101, the fourth switch 410 may electrically connect the first input port 350 with the fifth switch 420 to input a first signal provided through the first input port 350 into the first amplification circuit 360 as indicated by reference numeral 500 of FIG. 5. For example, when the electronic device 101 operates in the multi-transmission mode, the fourth switch 410 may electrically connect the first input port 350 with the fifth switch 420 to input the first signal provided form the first input port 350 into the first amplification circuit 360 as indicated by reference numeral 700 of FIG. 7. For example, when the power amplifier 320 operates in the high power mode in the single transmission mode of the electronic device 101, the fourth switch 410 may electrically connect the first input port 350 with the balun circuit 400 (for example, the input port of the balun circuit 400) to input the first signal provided through the first input port 350 into the balun circuit 400 as indicated by reference numeral 600 of FIG. 6.

According to one or more embodiments, the fifth switch 420 may be disposed on the first electrical path 340 between the fourth switch 410 and the first amplification circuit 360. The fifth switch 420 may electrically connect the first amplification circuit 360 with the fourth switch 410 or the balun circuit 400 (for example, an output port of the balun circuit 400) on the basis of the transmission mode of the electronic device 101 and/or the operation mode of the power amplifier 320. For example, when the power amplifier 320 operates in the low power mode in the single transmission mode of the electronic device 101, the fifth switch 420 may electrically connect the fourth switch 410 with the first amplification circuit 360 to input the first signal provided through the first input port 350 into the first amplification circuit 360 as indicated by reference numeral 500 of FIG. 5. For example, when the electronic device 101 operates in the multi-transmission mode, the fifth switch 420 may electrically connect the fourth switch 410 with the first amplification circuit 360 to input the first signal provided through the first input port 350 into the first amplification circuit 360 as indicated by reference numeral 700 of FIG. 7. For example, when the power amplifier 320 operates in the high power mode in the single transmission mode of the electronic device 101, the fifth switch 420 may electrically connect the balun circuit 400 (for example, the output port of the balun circuit 400) with the first amplification circuit 360 to input the output signal of the balun circuit 400 into the first amplification circuit 360 as indicated by reference numeral 600 of FIG. 6.

According to one or more embodiments, the sixth switch 422 may be disposed on the second electrical path 342 between the second input port 352 of the power amplifier 320 and the second amplification circuit 362. The sixth switch 422 may electrically connect the second amplification circuit 362 with the second input port 352 or the balun circuit 400 (for example, the output port of the balun circuit 400) on the basis of the transmission mode of the electronic device 101 and/or the operation mode of the power amplifier 320. For example, when the electronic device 101 operates in the multi-transmission mode, the sixth switch 422 may electrically connect the second input port 352 with the second amplification circuit 362 to input the second signal provided through the second input port 352 into the second amplification circuit 362 as indicated by reference numeral 710 of FIG. 7. For example, when the power amplifier 320 operates in the high power mode in the single transmission mode of the electronic device 101, the sixth switch 422 may electrically connect the balun circuit 400 (for example, the output port of the balun circuit 400) with the second amplification circuit 362 to input the output signal of the balun circuit 400 into the second amplification circuit 362 as indicated by reference numeral 600 of FIG. 6. For example, when the power amplifier 320 operates in the low power mode in the single transmission mode of the electronic device 101, the sixth switch 422 may block the electrical connection between the second input port 352 and the second amplification circuit 362 to not apply the input signal to the second amplification circuit 362.

According to one or more embodiments, the balun circuit 400 may separate the first signal provided from the first input port 350 through the fourth switch 410 into two signals having different phases. For example, the signal having a first phase separated by the balun circuit 400 may be input into the first amplification circuit 360 through the fifth switch 420. For example, the signal having a second phase which is an antiphase of the first phase separated by the balun circuit 400 may be input into the second amplification circuit 362 through the sixth switch 422.

According to one or more embodiments, the CP 300 may control the fourth switch 410, the fifth switch 420, and/or the sixth switch 422 included in the power amplifier 320 on the basis of the transmission mode of the electronic device 101 and/or the operation mode of the power amplifier 320.

According to an embodiment, when the power amplifier 320 operates in the low power mode in the single transmission mode of the electronic device 101, the CP 300 may control the fourth switch 410 and the fifth switch 420 to electrically connect the first input port 350 with the first amplification circuit 360 as illustrated in FIG. 5. For example, the first signal provided from the RFIC 310 through the first input port 350 may be input into the first amplification circuit 360 electrically connected or operatively connected to the first input port 350 by the fourth switch 410 and the fifth switch 420 as indicated by reference numeral 500.

According to an embodiment, when the electronic device 101 operates in the multi-transmission mode, the CP 300 may control the fourth switch 410, the fifth switch 420, and the sixth switch 422 to electrically connect the first input port 350 with the first amplification circuit 360 and electrically connect the second input port 352 with the second amplification circuit 362 as indicated by reference numerals 700 and 710 of FIG. 7. For example, the first signal provided from the RFIC 310 through the first input port 350 may be input into the first amplification circuit 360 electrically connected or operatively connected to the first input port 350 by the fourth switch 410 and the fifth switch 420. For example, the second signal provided from the RFIC 310 through the second input port 352 may be input into the second amplification circuit 362 electrically connected or operatively connected to the second input port 352 by the sixth switch 422.

According to an embodiment, when the power amplifier 320 operates in the high power mode in the single transmission mode of the electronic device 101, the CP 300 may control the fourth switch 410, the fifth switch 420, and/or the sixth switch 422 to electrically connect the first input port 350 with the balun circuit 400 and electrically connect the balun circuit 400 with the first amplification circuit 360 and the second amplification circuit 362 as indicated by reference numeral 600 of FIG. 6. For example, the first signal provided from the RFIC 310 through the first input port 350 may be input into the balun circuit 400 electrically connected or operatively connected to the first input port 350 by the fourth switch 410. For example, the signals having different phases separated by the balun circuit 400 may be input into the first amplification circuit 360 or the second amplification circuit 362 electrically connected or operatively connected to the balun circuit 400 by the fifth switch 420 or the sixth switch 422.

According to one or more embodiments, when the electronic device 101 operates in the single transmission mode, the power amplifier 320 may simultaneously use the first amplification circuit 360 and the second amplification circuit 362. For example, when the electronic device 101 operates in the single transmission mode, the power amplifier 320 may simultaneously use the first amplification circuit 360 and the second amplification circuit 362 regardless of target power for outputting a signal through at least one antenna 330. According to an embodiment, when the electronic device 101 operates in the single transmission mode, the CP 300 may control the fourth switch 410, the fifth switch 420, and the sixth switch 422 to electrically connect the first input port 350 with the balun circuit 400 and electrically connect the balun circuit 400 with the first amplification circuit 360 and the second amplification circuit 362 as indicated by reference numeral 600 of FIG. 6.

Figure 8A:
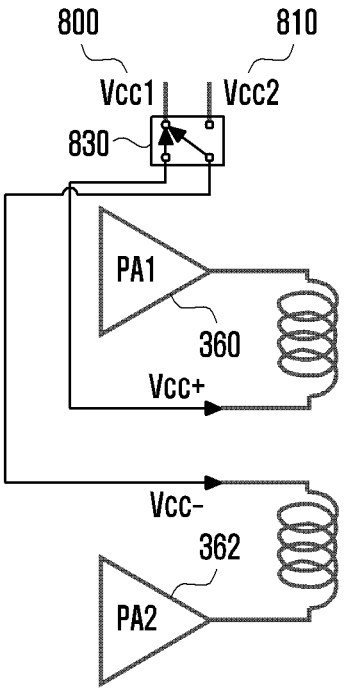
FIG. 8A illustrates an example of a power source of a power amplifier for signal transmission in an electronic device according to one or more embodiments.
Figure 8B:
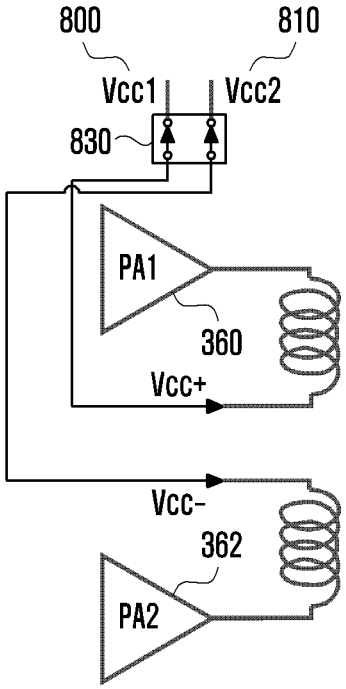
FIG. 8B illustrates an example of a structure of power of a power amplifier for multiple transmissions in an electronic device according to one or more embodiments.

FIG. 8A illustrates an example of a power source of a power amplifier for single transmission in an electronic device according to one or more embodiments. FIG. 8B illustrates an example of a power source of a power amplifier for multiple transmissions in an electronic device according to one or more embodiments.

According to one or more embodiments referring to FIGS. 8A and 8B, the electronic device 101 may include a plurality of power supplies (first power 800 and second power 810) for driving the power amplifier 320. According to an embodiment, when the electronic device 101 operates in the single transmission mode, the electronic device 101 may control the power amplifier 320 to allow the first amplification circuit 360 and the second amplification circuit 362 of the power amplifier 320 to use the same power (for example, first power (Vcc1) 800 or second power (Vcc2) 810. For example, when the electronic device 101 operates in the single transmission mode, the CP 300 (or the power management module 188 of FIG. 1) may control a seventh switch 830 to electrically connect the first power 800 (or the second power (Vcc2) 810) with the first amplification circuit 360 and the second amplification circuit 362.

According to an embodiment, when the electronic device 101 operates in the multi-transmission mode, the electronic device 101 may control the power amplifier 320 to allow the first amplification circuit 360 and the second amplification circuit 362 of the power amplifier 320 to use different power supplies (for example, the first power (Vcc1) 800 and the second power (Vcc2) 810). For example, when the electronic device 101 operates in the multi-transmission mode, the CP 300 (or the power management module 188 of FIG. 1) may control the seventh switch 830 to electrically connect the first power 800 with the first amplification circuit 360 and electrically connect the second power (Vcc2) 810 with the second amplification circuit 362.

Figure 9:
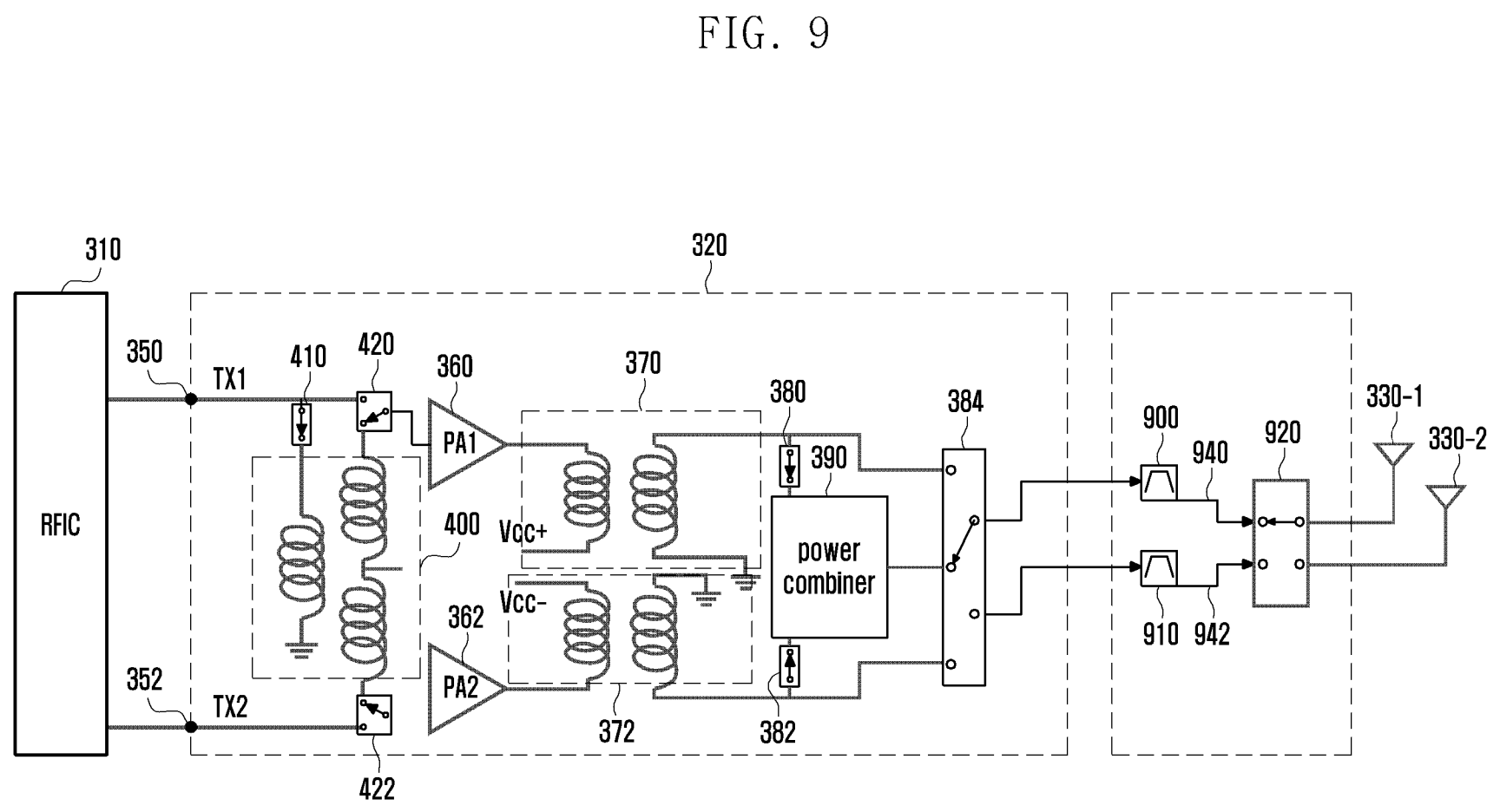

FIG. 9 illustrates an example of a structure for supporting multiple transmissions by an electronic device according to one or more embodiments.

According to one or more embodiments referring to FIG. 9, the power amplifier 320 may include the first amplification circuit 360, the second amplification circuit 362, the first transformer 370, the second transformer 372, the first switch 380, the second switch 382, the third switch 384, the power combiner 390, the balun circuit 400, the fourth switch 410, the fifth switch 420, and/or the sixth switch 422. According to an embodiment, in order to avoid overlapping with FIGS. 3 and 4, a detailed description of the first amplification circuit 360, the second amplification circuit 362, the first switch 380, the second switch 382, the third switch 384, the power combiner 390, the fourth switch 410, the fifth switch 420, and/or the sixth switch 422 is omitted.

According to one or more embodiments, the balun circuit 400 may convert the first signal provided through the first input port 350 of the power amplifier 320 and the fourth switch 410 into a differential signal having a different phase. According to an embodiment, the balun circuit 400 may provide a signal having a first phase to the first amplification circuit 360 through the fifth switch 420 and provide a signal having a second phase that is an antiphase of the first phase to the second amplification circuit 362 through the sixth switch 422.

According to one or more embodiments, the second transformer 372 may invert the phase of the second output signal provided from the second amplification circuit 362 and output the inverted second output signal. For example, the second transformer 372 may invert the phase of the second output signal provided from the second amplification circuit 362 to have a phase which is the same as the output signal of the first transformer 370 on the basis of a coil formed in a direction opposite to the first transformer 370.

According to one or more embodiments, the third switch 384 may electrically connect at least one of the first switch 380, the second switch 382, or the power combiner 390 with each transmission path (the first transmission path 940 or the second transmission path 942) on the basis of the operation mode on the power amplifier 320.

According to an embodiment, when the power amplifier 320 operates in the low power mode in the single transmission mode of the electronic device 101, the third switch 384 may electrically connect the first electrical path 340 with a first transmission path 940 corresponding to a first frequency band (for example, B1 band) or a second transmission path 942 corresponding to a second frequency band (for example, B3 band). For example, the third switch 384 may electrically connect the first electrical path 340 with the first transmission path 940 or the second transmission path 942 on the basis of a frequency band for transmitting a signal by the electronic device 101.

According to an embodiment, when the electronic device 101 operates in the multi-transmission mode, the third switch 384 may electrically connect the first electrical path 340 with the first transmission path 940 or the second transmission path 942. The third switch 384 may electrically connect the second electrical path 342 with the second transmission path 942 or the first transmission path 940 different from that of the first electrical path 340.

According to an embodiment, when the power amplifier 320 operates in the high power mode in the single transmission mode of the electronic device 101, the third switch 384 may electrically connect the output port of the power combiner 390 with the first transmission path 940 or the second transmission path 942. For example, the third switch 384 may electrically connect the output port of the power combiner 390 with the first transmission path 940 or the second transmission path 942 on the basis of a frequency band for transmitting a signal by the electronic device 101.

According to one or more embodiments, a first filter 900 may be disposed on the first transmission path 940 and may filter a signal provided from the third switch 384 to transmit only an RF signal in the first frequency band.

According to one or more embodiments, a second filter 910 may be disposed on the second transmission path 942 and may filter a signal provided from the third switch 384 to transmit only an RF signal in the second frequency band.

According to one or more embodiments, an eighth switch 920 may electrically connect the first filter 900 and/or the second filter 910 with the first antenna 330-1 and/or the second antenna 330-2. According to an embodiment, when the electronic device 101 transmits a signal in the single transmission mode, the eighth switch 920 may electrically connect the first filter 900 or the second filter 910 with the first antenna 330-1 or the second antenna 330-2. According to an embodiment, when the electronic device 101 transmits a signal in the multi-transmission mode, the eighth switch 920 may electrically connect the first filter 900 with the first antenna 330-1 or the second antenna 330-2. The eighth switch 920 may electrically connect the second filter 910 with the second antenna 330-2 or the first antenna 330-1, different from the antenna (for example, the first antenna 330-1 or the second antenna 330-2) electrically connected or operatively connected to the first filter 900.

Figure 10:
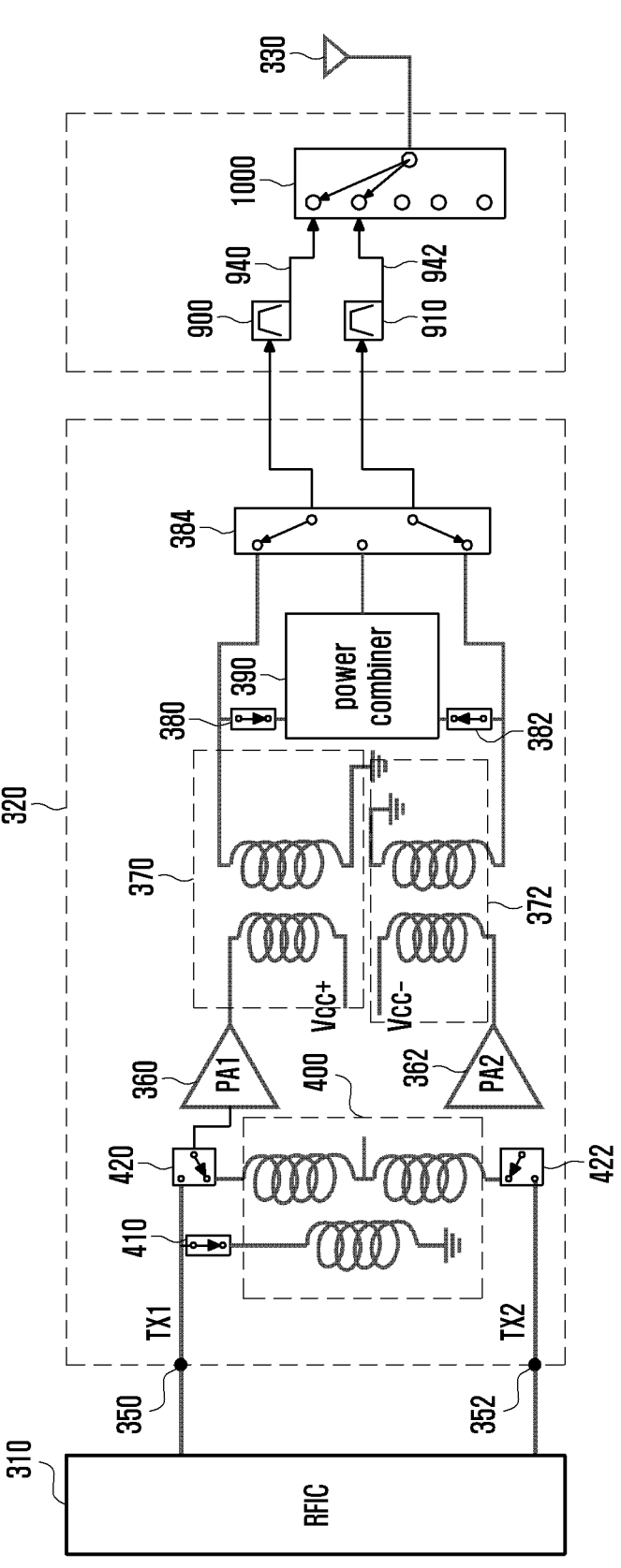
FIG. 10 illustrates another example of the structure for supporting multiple transmissions by an electronic device according to one or more embodiments.

FIG. 10 illustrates another example of the structure for supporting multiple transmissions by an electronic device according to one or more embodiments.

According to one or more embodiments referring to FIG. 10, the power amplifier 320 may include the first amplification circuit 360, the second amplification circuit 362, the first transformer 370, the second transformer 372, the first switch 380, the second switch 382, the third switch 384, the power combiner 390, the balun circuit 400, the fourth switch 410, the fifth switch 420, and/or the sixth switch 422. According to an embodiment, in order to avoid overlapping with FIGS. 3 and 4, a detailed description of the first amplification circuit 360, the second amplification circuit 362, the first transformer 370, the second transformer 372, the first switch 380, the second switch 382, the third switch 384, the power combiner 390, the fourth switch 410, the fifth switch 420, and/or the sixth switch 422 is omitted.

According to one or more embodiments, a ninth switch 1000 may electrically connect the first filter 900 and/or the second filter 910 with the antenna 330. According to an embodiment, when the electronic device 101 transmits a signal in the single transmission mode, the ninth switch 1000 may electrically connect the first filter 900 or the second filter 910 with the antenna 330. According to an embodiment, when the electronic device 101 transmits a signal in the multi-transmission mode, the ninth switch 1000 may electrically connect the first filter 900 and the second filter 910 with the antenna 330.

According to one or more embodiments, an electronic device (for example, the electronic device 101 of FIG. 1, 2, 3, 4, 5, 6, 7, 9, or 10) may include at least one antenna (for example, the antenna module 197 of FIG. 1, the antenna 248 of FIG. 2, or at least one antenna 330 of FIG. 3, 4, 5, 6, 7, 9, or 10) and a power amplifier (for example, the power amplifier 320 of FIG. 3, 4, 5, 6, 7, 9, or 10) electrically connected or operatively connected to the at least one antenna, and the power amplifier may include a first amplification circuit (for example, the first amplification circuit 360 of FIG. 3, 4, 5, 6, 7, 9, or 10) disposed on a first electrical path (for example, the first electrical path 340 of FIG. 3, 4, 5, 6, 7, 9, or 10) between a first input port (for example, the first input port 350 of FIG. 3, 4, 5, 6, 7, 9, or 10) of the power amplifier and the at least one antenna and configured to amplify a first signal provided through the first input port and output a first output signal, a first transformer (for example, the first transformer 370 of FIG. 3, 4, 5, 6, 7, 9, or 10) disposed on the first electrical path between the first amplification circuit and the at least one antenna, a first switch (for example, the first switch 380 of FIG. 3, 4, 5, 6, 7, 9, or 10) disposed on the first electrical path between the first transformer and the at least one antenna and configured to electrically connect the first transformer with a third switch (for example, the third switch 384 of FIG. 3, 4, 5, 6, 7, 9, or 10) or a power combiner, a second amplification circuit (for example, the second amplification circuit 362 of FIG. 3, 4, 5, 6, 7, 9, or 10) disposed on a second electrical path (for example, the second electrical path 342 of FIG. 3, 4, 5, 6, 7, 9, or 10) between a second input port (for example, the second input port 352 of FIG. 3, 4, 5, 6, 7, 9, or 10) of the power amplifier and the at least one antenna and configured to amplify a second signal provided through the second input port and generate a second output signal, a second transformer (for example, the second transformer 372 of FIG. 3, 4, 5, 6, 7, 9, or 10) disposed on the second electrical path between the second amplification circuit and the at least one antenna, a second switch (for example, the second switch 382 of FIG. 3, 4, 5, 6, 7, 9, or 10) disposed on the second electrical path between the second transformer and the at least one antenna and configured to electrically connect the second transformer with the third switch or the power combiner, the power combiner (for example, the power combiner 390 of FIG. 3, 4, 5, 6, 7, 9, or 10) configured to combine power of the first output signal provided from the first transformer through the first switch and the second output signal provided from the second transformer through the second switch and generate a third output signal, and the third switch (for example, the third switch 384 of FIG. 3, 4, 5, 6, 7, 9, or 10) configured to electrically connect at least one of the first switch or the second switch or an output port of the power combiner with the at least one antenna.

According to one or more embodiments, the first transformer may be configured to maintain a phase of the first output signal provided from the first amplification circuit, and the second transformer may be configured to invert a phase of the second output signal provided from the second amplification circuit.

According to one or more embodiments, the power amplifier may further include a balun circuit (for example, the balun circuit 400 of FIG. 4, 5, 6, 7, 9, or 10), a fourth switch (for example, the fourth switch 410 of FIG. 4, 5, 6, 7, 9, or 10) disposed on the first electrical path between the first input port and the first amplification circuit and configured to electrically connect the first input port with a fifth switch or the balun circuit, the fifth switch (for example, the fifth switch 420 of FIG. 4, 5, 6, 7, 9, or 10) disposed on the first electrical path between the fourth switch and the first amplification circuit and configured to electrically connect the first amplification circuit with the fourth switch or the balun circuit, and a sixth switch (for example, the sixth switch 422 of FIG. 4, 5, 6, 7, 9, or 10) disposed on the second electrical path between the second input port and the second amplification circuit and configured to electrically connect the second amplification circuit with the second input port or the balun circuit.

According to one or more embodiments, the electronic device may further include a processor operatively connected to the power amplifier, the processor may be configured to control the fourth switch and the fifth switch to electrically connect the first input port with the first amplification circuit in case that target power of a signal transmitted by the electronic device in a single frequency band satisfies reference power, and the first signal provided through the first input port may be input into the first amplification circuit.

According to one or more embodiments, in case that the target power of the signal transmitted by the electronic device through the single frequency band satisfies the reference power, the processor may be configured to control the first switch and the third switch to electrically connect the first transformer with the at least one antenna, and the first output signal of the first amplification circuit may be output to the at least one antenna through the first transformer, the first switch, and the third switch.

According to one or more embodiments, in case that the target power of the signal transmitted by the electronic device through the single frequency band does not satisfy the reference power, the processor may be configured to control the fourth switch, the fifth switch, and the sixth switch to electrically connect the first input port with an input port of the balun circuit and electrically connect an output port of the balun circuit with the first amplification circuit and the second amplification circuit, the first signal provided through the first input port may be input into the balun circuit, and an output signal of the balun circuit may be input into the first amplification circuit and the second amplification circuit.

According to one or more embodiments, in case that the target power of the signal transmitted by the electronic device through the single frequency band does not satisfy the reference power, the processor may be configured to control the first switch, the second switch, and the third switch to electrically connect the first transformer and the second transformer with the power combiner and electrically connect the power combiner with the at least one antenna, the power combiner may be configured to combine the first output signal provided through the first transformer and the second output signal provided through the second transformer and generate the third output signal, and the third output signal generated by the power combiner may be output to the at least one antenna through the third switch.

According to one or more embodiments, the electronic device may further include a power supply circuit (for example, the seventh switch 830 of FIG. 8A or 8B), and the processor may be configured to, in case that the electronic device transmits the signal through the single frequency band, control the power supply circuit to supply first power to the first amplification circuit and the second amplification circuit.

According to one or more embodiments, in case that the electronic device transmits the signal through the multiple frequency bands, the processor may be configured to control the fourth switch, the fifth switch, and the sixth switch to electrically connect the first input port with the first amplification circuit and electrically connect the second input port with the second amplification circuit, the first signal provided through the first input port may be input into the first amplification circuit, and the second signal provided through the second input port may be input into the second amplification circuit.

According to one or more embodiments, in case that the electronic device transmits the signal through the multiple frequency bands, the processor may be configured to control the first switch, the second switch, and the third switch to electrically connect the first transformer with the at least one antenna and electrically connect the second transformer with the at least one antenna, wherein the first output signal of the first amplification circuit may be output to at least one antenna through the first transformer, the first switch, and the third switch, and the second output signal of the second amplification circuit may be output to the at least one antenna through the second transformer, the second switch, and the third switch.

According to one or more embodiments, the electronic device may further include a power supply circuit, the processor may be configured to, in case that the electronic device transmits the signal through the multiple frequency bands, control the power supply circuit to supply first power to the first amplification circuit and supply second power different from the first power to the second amplification circuit.

According to one or more embodiments, a power amplification device (for example, the power amplifier 320 of FIG. 3, 4, 5, 6, 7, 9, or 10) may include a first amplification circuit (for example, the first amplification circuit 360 of FIG. 3, 4, 5, 6, 7, 9, or 10) disposed on a first electrical path (for example, the first electrical path 340 of FIG. 3, 4, 5, 6, 7, 9, or 10) between a first input port (for example, the first input port 350 of FIG. 3, 4, 5, 6, 7, 9, or 10) of the power amplification device and the at least one output port of the power amplification device and configured to amplify a first signal provided through the first input port and generate a first output signal, a first transformer (for example, the first transformer 370 of FIG. 3, 4, 5, 6, 7, 9, or 10) disposed on the first electrical path between the first amplification circuit and the at least one output port, a first switch (for example, the first switch 380 of FIG. 3, 4, 5, 6, 7, 9, or 10) disposed on the first electrical path between the first transformer and the at least one output port and configured to electrically connect the first transformer with a third switch (for example, the third switch 384 of FIG. 3, 4, 5, 6, 7, 9, or 10) or a power combiner (for example, the power combiner 390 of FIG. 3), a second amplification circuit (for example, the second amplification circuit 362 of FIG. 3, 4, 5, 6, 7, 9, or 10) disposed on a second electrical path (for example, the second electrical path 342 of FIG. 3, 4, 5, 6, 7, 9, or 10) between a second input port (for example, the second input port 352 of FIG. 3, 4, 5, 6, 7, 9, or 10) of the power amplification device and the at least one output port and configured to amplify a second signal provided through the second input port and generate a second output signal, a second transformer (for example, the second transformer 372 of FIG. 3, 4, 5, 6, 7, 9, or 10) disposed on the second electrical path between the second amplification circuit and the at least one output port, a second switch (for example, the second switch 382 of FIG. 3, 4, 5, 6, 7, 9, or 10) disposed on the second electrical path between the second transformer and the at least one output port and configured to electrically connect the second transformer with the third switch or the power combiner, the power combiner (for example, the power combiner 390 of FIG. 3, 4, 5, 6, 7, 9, or 10) configured to combine power of the first output signal provided from the first transformer through the first switch and the second output signal provided from the second transformer through the second switch and generate a third output signal, and the third switch (for example, the third switch 384 of FIG. 3, 4, 5, 6, 7, 9, or 10) configured to electrically connect at least one of the first switch or the second switch or an output port of the power combiner with the at least one output port.

According to one or more embodiments, the first transformer may be configured to maintain a phase of the first output signal provided from the first amplification circuit, and the second transformer may be configured to invert a phase of the second output signal provided from the second amplification circuit.

According to one or more embodiments, the power amplification device may further include a balun circuit (for example, the balun circuit 400 of FIG. 4, 5, 6, 7, 9, or 10), a fourth switch (for example, the fourth switch 410 of FIG. 4, 5, 6, 7, 9, or 10) disposed on the first electrical path between the first input port and the first amplification circuit and configured to electrically connect the first input port with a fifth switch or the balun circuit, the fifth switch (for example, the fifth switch 420 of FIG. 4, 5, 6, 7, 9, or 10) disposed on the first electrical path between the fourth switch and the first amplification circuit and configured to electrically connect the first amplification circuit with the fourth switch or the balun circuit, and a sixth switch (for example, the sixth switch 422 of FIG. 4, 5, 6, 7, 9, or 10) disposed on the second electrical path between the second input port and the second amplification circuit and configured to electrically connect the second amplification circuit with the second input port or the balun circuit.

According to one or more embodiments, in case that target power of a signal transmitted through a single frequency band satisfies reference power, the power amplification device may be configured to control the fourth switch and the fifth switch to electrically connect the first input port with the first amplification circuit, and the first signal provided through the first input port may be input into the first amplification circuit.

According to one or more embodiments, in case that target power of the signal transmitted by the electronic device through the single frequency band satisfies the reference power, the power amplification device may be configured to control the first switch and the third switch to electrically connect the first transformer with the at least one antenna, and the first output signal of the first amplification circuit may be output to the at least one antenna through the first transformer, the first switch, and the third switch.

According to one or more embodiments, in case that target power of the signal transmitted by the electronic device through the single frequency band does not satisfy the reference power, the power amplification device may be configured to control the fourth switch, the fifth switch, and the sixth switch to electrically connect the first input port with an input port of the balun circuit and electrically connect an output port of the balun circuit with the first amplification circuit and the second amplification circuit, the first signal provided through the first input port may be input into the balun circuit, and an output signal of the balun circuit may be input into the first amplification circuit and the second amplification circuit.

According to one or more embodiments, in case that target power of the signal transmitted by the electronic device through the single frequency band does not satisfy the reference power, the power amplification device may be configured to control the first switch, the second switch, and the third switch to electrically connect the first transformer and the second transformer with the power combiner and electrically connect the power combiner with the at least one output port, the power combiner may be configured to combine the first output signal provided through the first transformer and the second output signal provided through the second transformer and generate the third output signal, and the third output signal generated by the power combiner may be output to the at least one output port through the third switch.

According to one or more embodiments, in case that the electronic device transmits the signal through the multiple frequency bands, the power amplification device may be configured to control the fourth switch, the fifth switch, and the sixth switch to electrically connect the first input port with the first amplification circuit and electrically connect the second input port with the second amplification circuit, the first signal provided through the first input port may be input into the first amplification circuit; and the second signal provided through the second input port may be input into the second amplification circuit.

According to one or more embodiments, in case that the electronic device transmits the signal through the multiple frequency bands, the power amplification device may be configured to control the first switch, the second switch, and the third switch to electrically connect the first transformer with the at least one antenna and electrically connect the second transformer with the at least one output port, the first output signal of the first amplification circuit may be output to at least one output port through the first transformer, the first switch, and the third switch, and the second output signal of the second amplification circuit may be output to the at least one output port through the second transformer, the second switch, and the third switch.

Figure 11:
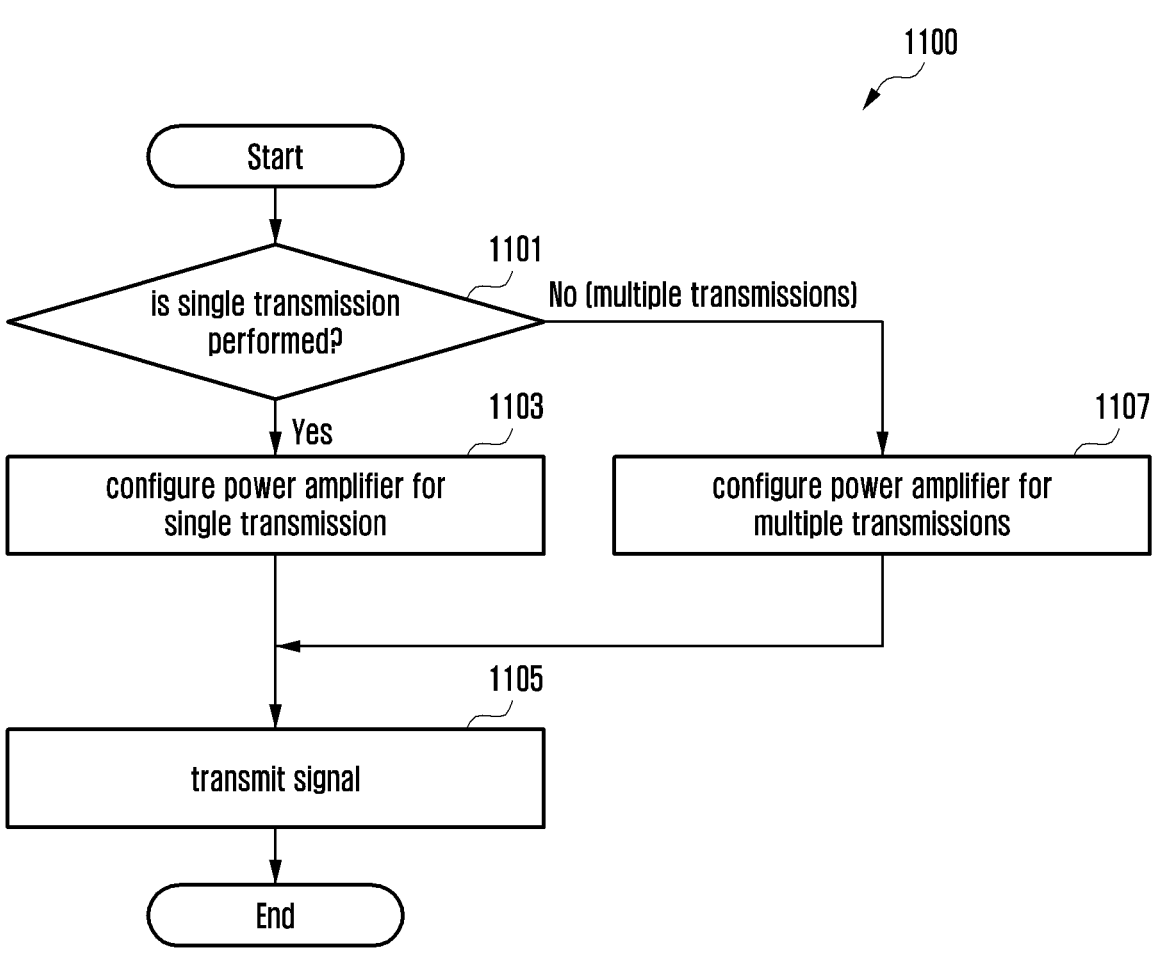
FIG. 11 illustrates an example of a flowchart illustrating a process in which an electronic device controls a power amplifier according to one or more embodiments.

FIG. 11 illustrates an example of a flowchart illustrating a process in which an electronic device controls a power amplifier according to one or more embodiments. In the following embodiment, operations may be sequentially performed but the sequential performance is not necessary. For example, the order of operations may be changed, and at least two operations may be performed in parallel. For example, the electronic device of FIG. 11 may be the electronic device 101 of FIG. 1, 2, 3, 4, 5, 6, 7, 9, or 10.

According to one or more embodiments referring to FIG. 11, the electronic device (for example, the processor 120 of FIG. 1, the wireless communication module 192, the wireless communication module 192 of FIG. 2, or the CP 300 of FIG. 3) may identify whether single transmission is performed through at least one antenna (for example, the antenna 330 of FIG. 3) in operation 1101. According to an embodiment, the CP 300 may identify whether the electronic device 101 performs single transmission on the basis of a frequency band used by the electronic device 101 to transmit a signal through at least one antenna 330. For example, when the electronic device 101 uses a single frequency band to transmit a signal, the CP 300 may determine that the electronic device 101 performs the single transmission. In another example, when the electronic device 101 uses a multiple frequency bands to transmit a signal, the CP 300 may determine that the electronic device 101 performs multiple transmissions.

According to one or more embodiments, when the electronic device (for example, the processor 120, the wireless communication module 192, or the CP 300) performs single transmission (for example, 'Yes' of operation 1101), a power amplifier (for example, the power amplifier 320 of FIG. 3) may be configured for the single transmission in operation 1103. According to an embodiment, when the electronic device 101 performs single transmission (for example, single transmission mode), the CP 300 may control the power amplifier 320 to amplify a signal by simultaneously using the first amplification circuit 360 and the second amplification circuit 362. For example, the CP 300 may control the first switch 380, the second switch 382, the fourth switch 410, the fifth switch 420, and/or the sixth switch 422 to amplify a signal by simultaneously using the first amplification circuit 360 and the second amplification circuit 362 as illustrated in FIG. 6.

According to one or more embodiments, the electronic device (for example, the processor 120, the wireless communication module 192, or the CP 300) may amplify a signal on the basis of a configuration of the power amplifier (for example, the power amplifier 320 of FIG. 3) for single transmission and output the signal to the outside through at least one antenna (for example, the antenna 330 of FIG. 3). According to an embodiment, the electronic device 101 may combine signals amplified through the first amplification circuit 360 and the second amplification circuit 362 into one signal by the power combiner 390. The electronic device 101 may output the signal combined by the power combiner 390 to the outside through the first antenna 330-1 or the second antenna 330-2.

According to one or more embodiments, when the electronic device (for example, the processor 120, the wireless communication module 192, or the CP 300) does not perform single transmission (for example, 'No' of operation 1101), the power amplifier (for example, the power amplifier 320 of FIG. 3) may be configured for multiple transmissions in operation 1109. According to an embodiment, when the electronic device 101 performs multiple transmissions (for example, multi-transmission mode), the CP 300 may control the power amplifier 320 to amplify a signal in a first frequency band through the first amplification circuit 360 and amplify a signal in a second frequency band through the second amplification circuit 362. For example, the CP 300 may control the first switch 380, the second switch 382, the fourth switch 410, the fifth switch 420, and/or the sixth switch 422 to amplify signals in different frequency bands through the first amplification circuit 360 and the second amplification circuit 362 as illustrated in FIG. 7.

According to one or more embodiments, the electronic device (for example, the processor 120, the wireless communication module 192, or the CP 300) may amplify signals on the basis of a configuration of the power amplifier (for example, the power amplifier 320 of FIG. 3) for multiple transmissions and output the signals to the outside through at least one antenna (for example, the antenna 330 of FIG. 3) in operation 1105. According to an embodiment, the electronic device 101 may output the signal amplified by the first amplification circuit 360 to at least one antenna 330 through the first transmission path 940 or the second transmission path 942. The electronic device 101 may output the signal amplified by the second amplification circuit 362 to at least one antenna 330 through the second transmission path 942 or the first transmission path 940 different from that of the first amplification circuit 360.

Figure 12:
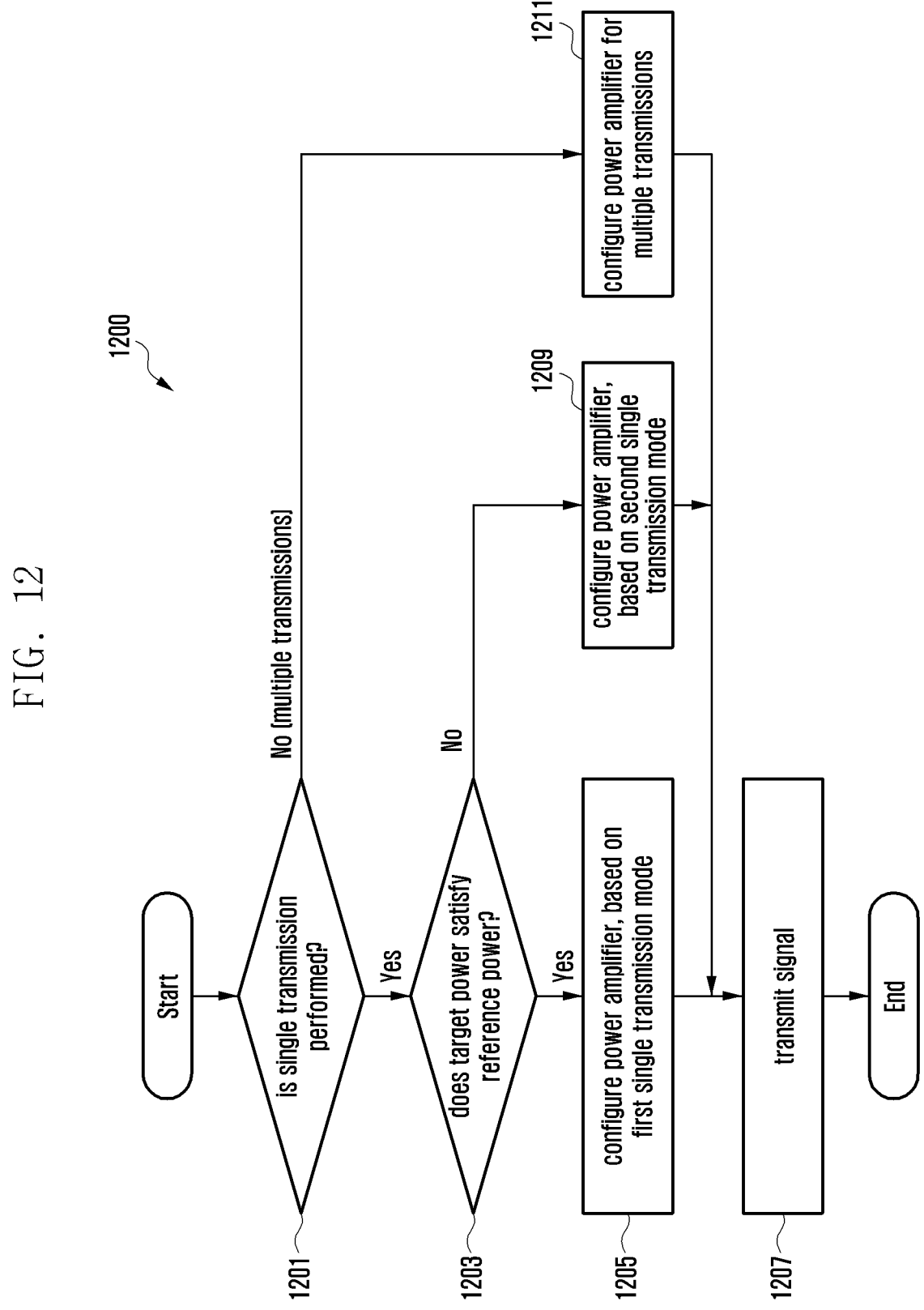
FIG. 12 illustrates another example of the flowchart in which the electronic device controls the power amplifier according to one or more embodiments.

FIG. 12 illustrates another example of the flowchart in which the electronic device controls the power amplifier according to one or more embodiments. In the following embodiment, operations may be sequentially performed but the sequential performance is not necessary. For example, the order of operations may be changed, and at least two operations may be performed in parallel. For example, the electronic device of FIG. 12 may be the electronic device 101 of FIG. 1, 2, 3, 9, or 10.

According to one or more embodiments referring to FIG. 12, the electronic device (for example, the processor 120 of FIG. 1, the wireless communication module 192, or the wireless communication module 192 of FIG. 2, or the CP 300 of FIG. 3) may identify whether single transmission is performed through at least one antenna (for example, the antenna 330 of FIG. 3) in operation 1201. According to an embodiment, when the electronic device 101 uses a single frequency band to transmit a signal through at least one antenna 330, the CP 300 may determine that the electronic device 101 performs single transmission. According to an embodiment, when the electronic device 101 uses multiple frequency bands to transmit signals through at least one antenna 330, the CP 300 may determine that the electronic device 101 performs multiple transmissions.

According to one or more embodiments, when the electronic device (for example, the processor 120, the wireless communication module 192, or the CP 300) performs single transmission (for example, 'Yes' of operation 1201), it may be identified whether target power for transmitting a signal through at least one antenna (for example, the antenna 330 of FIG. 3) satisfies reference power in operation 1203. According to an embodiment, when the target power for outputting a signal by the electronic device 101 through at least one antenna 330 is equal to or lower than the reference power, the CP 300 may determine that the target power satisfies the reference power. According to an embodiment, when the target power for outputting the signal by the electronic device 101 through at least one antenna 330 is higher than the reference power, the CP 300 may determine that the target power does not satisfy the reference power.

According to one or more embodiments, when the target power satisfies the reference power (for example, 'Yes' of operation 1203), the electronic device (for example, the processor 120, the wireless communication module 192, or the CP 300) may configure the power amplifier (for example, the power amplifier 320 of FIG. 3) on the basis of a first single transmission mode (for example, low power mode) in operation 1205. According to an embodiment, when the power amplifier 320 operates in the low power mode in the single transmission mode of the electronic device 101, the CP 300 may control the power amplifier 320 to amplify a signal through the first amplification circuit 360 (or the second amplification circuit 362). For example, the CP 300 may control the first switch 380, the second switch 382, the fourth switch 410, the fifth switch 420, and/or the sixth switch 422 to amplify the signal through the first amplification circuit 360 as illustrated in FIG. 5.

According to one or more embodiments, the electronic device (for example, the processor 120, the wireless communication module 192, or the CP 300) may amplify the signal on the basis of a configuration of the power amplifier (for example, the power amplifier 320 of FIG. 3) corresponding to the first single transmission mode and output the signal to the outside through at least one antenna (for example, the antenna 330 of FIG. 3) in operation 1207. According to an embodiment, the electronic device 101 may output the signal amplified by the first amplification circuit 360 (or the second amplification circuit 362) to the outside through the first antenna 330-1 or the second antenna 330-2.

According to one or more embodiments, when the target power does not satisfy the reference power (for example, 'No' of operation 1203), the electronic device (for example, the processor 120, the wireless communication module 192, or the CP 300) may configure the power amplifier (for example, the power amplifier 320 of FIG. 3) on the basis of a second single transmission mode (for example, a high power mode) in operation 1209. According to an embodiment, when the power amplifier 320 operates in the high power mode in the single transmission mode of the electronic device 101, the CP 300 may control the power amplifier 320 to amplify the signal by simultaneously using the first amplification circuit 360 and the second amplification circuit 362. For example, the CP 300 may control the first switch 380, the second switch 382, the fourth switch 410, the fifth switch 420, and/or the sixth switch 422 to amplify a signal by simultaneously using the first amplification circuit 360 and the second amplification circuit 362 as illustrated in FIG. 6.

According to one or more embodiments, the electronic device (for example, the processor 120, the wireless communication module 192, or the CP 300) may amplify the signal on the basis of a configuration of the power amplifier (for example, the power amplifier 320 of FIG. 3) corresponding to the second single transmission mode and output the signal to the outside through at least one antenna (for example, the antenna 330 of FIG. 3) in operation 1207. According to an embodiment, the electronic device 101 may combine signals amplified through the first amplification circuit 360 and the second amplification circuit 362 into one signal by the power combiner 390. The electronic device 101 may output the signal combined by the power combiner 390 to the outside through the first antenna 330-1 or the second antenna 330-2.

According to one or more embodiments, when the electronic device (for example, the processor 120, the wireless communication module 192, or the CP 300) does not perform single transmission (for example, 'No' of operation 1201), the power amplifier (for example, the power amplifier 320 of FIG. 3) may be configured on the basis of the multi-transmission mode in operation 1211. According to an embodiment, when the electronic device 101 operates in the multi-transmission mode, the CP 300 may control the power amplifier 320 to amplify the signal in the first frequency band through the first amplification circuit 360 and amplify the signal in the second frequency band through the second amplification circuit 362. For example, the CP 300 may control the first switch 380, the second switch 382, the fourth switch 410, the fifth switch 420, and/or the sixth switch 422 to amplify signals in different frequency bands through the first amplification circuit 360 and the second amplification circuit 362 as illustrated in FIG. 7.

According to one or more embodiments, the electronic device (for example, the processor 120, the wireless communication module 192, or the CP 300) may amplify the signal on the basis of a configuration of the power amplifier (for example, the power amplifier 320 of FIG. 3) corresponding to the multi-transmission mode and output the signal to the outside through at least one antenna (for example, the antenna 330 of FIG. 3) in operation 1207. According to an embodiment, the electronic device 101 may output the signal amplified by the first amplification circuit 360 to at least one antenna 330 through the first transmission path 940 or the second transmission path 942. The electronic device 101 may output the signal amplified by the second amplification circuit 362 to at least one antenna 330 through the second transmission path 942 or the first transmission path 940 different from that of the first amplification circuit 360.

Embodiments of the disclosure in the specifications and drawings are presented to easily describe the technical content according to embodiments of the disclosure and provide specific examples for helping understanding of embodiments of the disclosure, but do not intent to limit the scope of the embodiments of the disclosure. Therefore, the range of various embodiments of the disclosure should be construed such that all changes or changed forms derived on the basis of the technical idea of various embodiments of the disclosure as well as the embodiments disclosed herein are included in the range of various embodiments of the disclosure.

What is claimed is:

1. An electronic device comprising:
at least one antenna; and
a power amplifier electrically connected to the at least one antenna,
wherein the power amplifier comprises:
a first amplification circuit disposed on a first electrical path between a first input port of the power amplifier and the at least one antenna, the first amplification circuit being configured to amplify a first signal provided through the first input port and to output a first output signal;
a first transformer disposed on the first electrical path between the first amplification circuit and the at least one antenna;
a first switch disposed on the first electrical path between the first transformer and the at least one antenna, the first switch being configured to electrically connect the first transformer with a third switch or a power combiner;
a second amplification circuit disposed on a second electrical path between a second input port of the power amplifier and the at least one antenna, the second amplification circuit being configured to amplify a second signal provided through the second input port and to generate a second output signal;
a second transformer disposed on the second electrical path between the second amplification circuit and the at least one antenna;
a second switch disposed on the second electrical path between the second transformer and the at least one antenna, the second switch being configured to electrically connect the second transformer with the third switch or the power combiner;
the power combiner configured to combine power of the first output signal provided from the first transformer through the first switch and power of the second output signal provided from the second transformer through the second switch and to generate a third output signal; and
the third switch configured to electrically connect at least one of the first switch, the second switch, or an output port of the power combiner with the at least one antenna.

2. The electronic device of claim 1, wherein the first transformer is configured to maintain a phase of the first output signal provided from the first amplification circuit, and
wherein the second transformer is configured to invert a phase of the second output signal provided from the second amplification circuit.

3. The electronic device of claim 1, wherein the power amplifier further comprises:
a balun circuit;
a fourth switch disposed on the first electrical path between the first input port and the first amplification circuit, the fourth switch being configured to electrically connect the first input port with a fifth switch or the balun circuit;
the fifth switch disposed on the first electrical path between the fourth switch and the first amplification circuit, the fifth switch being configured to electrically connect the first amplification circuit with the fourth switch or the balun circuit; and a sixth switch disposed on the second electrical path between the second input port and the second amplification circuit, the sixth switch being configured to electrically connect the second amplification circuit with the second input port or the balun circuit.

4. The electronic device of claim 3, further comprising a processor operatively connected to the power amplifier, wherein the processor is configured to control the fourth switch and the fifth switch to electrically connect the first input port with the first amplification circuit, based on a target power of a signal transmitted by the electronic device in a single frequency band satisfying reference power, and wherein the first signal provided through the first input port is input into the first amplification circuit.

5. The electronic device of claim 4, wherein the processor is further configured to, based on the target power of the signal transmitted by the electronic device through the single frequency band satisfying the reference power, control the first switch and the third switch to operatively connect the first transformer with the at least one antenna, and wherein the first output signal of the first amplification circuit is output to the at least one antenna through the first transformer, the first switch, and the third switch.

6. The electronic device of claim 4, wherein the processor is further configured to, based on the target power of the signal transmitted by the electronic device through the single frequency band not satisfying the reference power, control the fourth switch, the fifth switch, and the sixth switch to electrically connect the first input port with an input port of the balun circuit and to electrically connect an output port of the balun circuit with the first amplification circuit and the second amplification circuit, wherein the first signal provided through the first input port is input into the balun circuit, and wherein an output signal of the balun circuit is input into the first amplification circuit and the second amplification circuit.

7. The electronic device of claim 6, wherein the processor is further configured to, based on the target power of the signal transmitted by the electronic device through the single frequency band not satisfying the reference power, control the first switch, the second switch, and the third switch to electrically connect the first transformer and the second transformer with the power combiner and to electrically connect the power combiner with the at least one antenna, wherein the power combiner is further configured to combine the first output signal provided through the first transformer and the second output signal provided through the second transformer and to generate the third output signal, and wherein the third output signal generated by the power combiner is output to the at least one antenna through the third switch.

8. The electronic device of claim 4, further comprising a power supply circuit, wherein the processor is further configured to, based on the electronic device transmitting the signal through the single frequency band, control the power supply circuit to supply first power to the first amplification circuit and the second amplification circuit.

9. The electronic device of claim 4, wherein the processor is further configured to, based on the electronic device transmitting the signal through multiple frequency bands, control the fourth switch, the fifth switch, and the sixth switch to electrically connect the first input port with the first amplification circuit and electrically connect the second input port with the second amplification circuit, wherein the first signal provided through the first input port is input into the first amplification circuit, and wherein the second signal provided through the second input port is input into the second amplification circuit.

10. The electronic device of claim 9, wherein the processor is further configured to, based on the electronic device transmitting the signal through the multiple frequency bands, control the first switch, the second switch, and the third switch to electrically connect the first transformer with the at least one antenna and to electrically connect the second transformer with the at least one antenna, wherein the first output signal of the first amplification circuit is output to the at least one antenna through the first transformer, the first switch, and the third switch, and wherein the second output signal of the second amplification circuit is output to the at least one antenna through the second transformer, the second switch, and the third switch.

11. The electronic device of claim 9, further comprising a power supply circuit, wherein the processor is further configured to, based on the electronic device transmitting the signal through the multiple frequency bands, control the power supply circuit to supply first power to the first amplification circuit and to supply second power different from the first power to the second amplification circuit.

12. The electronic device of claim 4, further comprising a radio frequency integrated circuit (RFIC) disposed between the power amplifier and the processor, the RFIC being configured to convert a baseband signal provided from the processor into a radio frequency (RF) signal.

13. The electronic device of claim 12, wherein the power amplifier is configured to amplify the RF signal provided from the RFIC and output the RF signal to an outside through the at least one antenna.

14. The electronic device of claim 12, further comprising an intermediate frequency integrated circuit (IFIC) disposed between the processor and the RFIC, the IFIC being configured to convert the baseband signal provided from the processor into an intermediate frequency (IF) signal, wherein the RFIC is further configured to convert the IF signal provided from the IFIC into the RF signal.

15. A power amplification device comprising:

a first amplification circuit disposed on a first electrical path between a first input port of the power amplification device and at least one output port of the power amplification device, the first amplification circuit being configured to amplify a first signal provided through the first input port and to generate a first output signal;

a first transformer disposed on the first electrical path between the first amplification circuit and the at least one output port;

a first switch disposed on the first electrical path between the first transformer and the at least one output port, the first switch being configured to electrically connect the first transformer with a third switch or a power combiner;

a second amplification circuit disposed on a second electrical path between a second input port of the power amplification device and the at least one output port, the second amplification circuit being configured to amplify a second signal provided through the second input port and to generate a second output signal;

a second transformer disposed on the second electrical path between the second amplification circuit and the at least one output port;

a second switch disposed on the second electrical path between the second transformer and the at least one output port, the second switch being configured to electrically connect the second transformer with the third switch or the power combiner;

the power combiner configured to combine power of the first output signal provided from the first transformer through the first switch and power of the second output signal provided from the second transformer through the second switch and to generate a third output signal; and the third switch configured to electrically connect at least one of the first switch, the second switch, or an output port of the power combiner with at least one antenna.

16. The power amplification device of claim 15, wherein the first transformer is configured to maintain a phase of the first output signal provided from the first amplification circuit, and wherein the second transformer is configured to invert a phase of the second output signal provided from the second amplification circuit.

17. The power amplification device of claim 15, further comprising:

a balun circuit;

a fourth switch disposed on the first electrical path between the first input port and the first amplification circuit, the fourth switch being configured to electrically connect the first input port with a fifth switch or the balun circuit;

the fifth switch disposed on the first electrical path between the fourth switch and the first amplification circuit, the fifth switch being configured to electrically connect the first amplification circuit with the fourth switch or the balun circuit; and a sixth switch disposed on the second electrical path between the second input port and the second amplification circuit, the sixth switch being configured to electrically connect the second amplification circuit with the second input port or the balun circuit.

18. The power amplification device of claim 17, wherein the power amplification device is configured to control the fourth switch and the fifth switch to electrically connect the first input port with the first amplification circuit, based on a target power of a signal transmitted by an electronic device in a single frequency band satisfying reference power, and wherein the first signal provided through the first input port is input into the first amplification circuit.

19. The power amplification device of claim 18, wherein the power amplification device is further configured to, based on the target power of the signal transmitted by the electronic device through the single frequency band satisfying the reference power, control the first switch and the third switch to operatively connect the first transformer with the at least one output port, and wherein the first output signal of the first amplification circuit is output to the at least one output port through the first transformer, the first switch, and the third switch.

20. The power amplification device of claim 18, wherein the power amplification device is further configured to, based on the target power of the signal transmitted by the electronic device through the single frequency band not satisfying the reference power, control the fourth switch, the fifth switch, and the sixth switch to electrically connect the first input port with an input port of the balun circuit and to electrically connect an output port of the balun circuit with the first amplification circuit and the second amplification circuit, wherein the first signal provided through the first input port is input into the balun circuit, and wherein an output signal of the balun circuit is input into the first amplification circuit and the second amplification circuit.

* * * * *